(12) United States Patent
Choi et al.

(10) Patent No.: US 12,424,589 B2
(45) Date of Patent: Sep. 23, 2025

(54) CONTIGUOUS SHIELD STRUCTURES IN MICROELECTRONIC ASSEMBLIES HAVING HYBRID BONDING

(71) Applicant: Intel Corporation, Santa Clara, CA (US)

(72) Inventors: Beomseok Choi, Chandler, AZ (US); Adel A. Elsherbini, Tempe, AZ (US); Han Wui Then, Portland, OR (US); Johanna M. Swan, Scottsdale, AZ (US); Shawna M. Liff, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 959 days.

(21) Appl. No.: 17/342,826

(22) Filed: Jun. 9, 2021

(65) Prior Publication Data

US 2022/0399305 A1 Dec. 15, 2022

(51) Int. Cl.
| | |
|---|---|
| *H01L 25/065* | (2023.01) |
| *H01L 23/00* | (2006.01) |
| *H01L 23/552* | (2006.01) |
| *H01L 23/66* | (2006.01) |
| *H01L 25/00* | (2006.01) |

(52) U.S. Cl.
CPC ........ *H01L 25/0652* (2013.01); *H01L 23/552* (2013.01); *H01L 23/66* (2013.01); *H01L 24/08* (2013.01); *H01L 24/80* (2013.01); *H01L 25/50* (2013.01); *H01L 2223/6627* (2013.01); *H01L 2224/08145* (2013.01); *H01L 2224/80895* (2013.01); *H01L 2224/80896* (2013.01);
(Continued)

(58) Field of Classification Search
CPC ... H01L 25/0652; H01L 23/552; H01L 23/66; H01L 24/08; H01L 24/80; H01L 25/50; H01L 2223/6627; H01L 2224/08145; H01L 2224/80895; H01L 2224/80896; H01L 2225/06537; H01L 2225/06586; H01L 2924/3025; H01L 24/09; H01L 2224/08146; H01L 2224/08225; H01L 2224/08265; H01L 2225/06541; H01L 2225/06548; H01L 2225/06589
See application file for complete search history.

(56) References Cited

U.S. PATENT DOCUMENTS

| | | |
|---|---|---|
| 7,679,344 B2 | 3/2010 | Carlson et al. |
| 8,335,084 B2 | 12/2012 | Lee et al. |

(Continued)

*Primary Examiner* — Marlon T Fletcher
*Assistant Examiner* — Samuel Jonathan Smith
(74) *Attorney, Agent, or Firm* — Akona IP PC

(57) ABSTRACT

Microelectronic assemblies, and related devices and methods, are disclosed herein. In some embodiments, a microelectronic assembly may include a first microelectronic component, embedded in a first dielectric layer, including a surface and one or more side surfaces at least partially encapsulated by a first magnetic conductive material; and a second microelectronic component, embedded in a second dielectric layer on the first dielectric layer, including a surface and one or more side surfaces at least partially encapsulated by a second magnetic conductive material, wherein the second microelectronic component is coupled to the surface of the first microelectronic component by a hybrid bonding region, and wherein the second magnetic conductive material is coupled to the first magnetic conductive material.

16 Claims, 11 Drawing Sheets

(52) U.S. Cl.
CPC ............... *H01L 2225/06537* (2013.01); *H01L 2225/06586* (2013.01); *H01L 2924/3025* (2013.01)

(56) References Cited

U.S. PATENT DOCUMENTS

| | | |
|---|---|---|
| 8,692,368 B2 | 4/2014 | Pan et al. |
| 9,129,817 B2 | 9/2015 | Elsherbini et al. |
| 9,229,466 B2 | 1/2016 | Saraswat et al. |
| 2014/0217547 A1 | 8/2014 | Elsherbini et al. |
| 2017/0025369 A1 | 1/2017 | Gulpen et al. |
| 2018/0138155 A1* | 5/2018 | Kim .................... H01L 25/0657 |
| 2019/0189599 A1* | 6/2019 | Baloglu ................ H01L 23/367 |
| 2020/0091128 A1* | 3/2020 | Elsherbini ........... H01L 23/5386 |

* cited by examiner

CONTIGUOUS SHIELD STRUCTURES IN MICROELECTRONIC ASSEMBLIES HAVING HYBRID BONDING

BACKGROUND

Integrated circuit (IC) dies are coupled to each other by hybrid bonding for improved interconnect pitch and reduced z-height. The smaller interconnect pitch and z-height achievable by hybrid bonding increases signal crosstalk and decreases signal performance.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
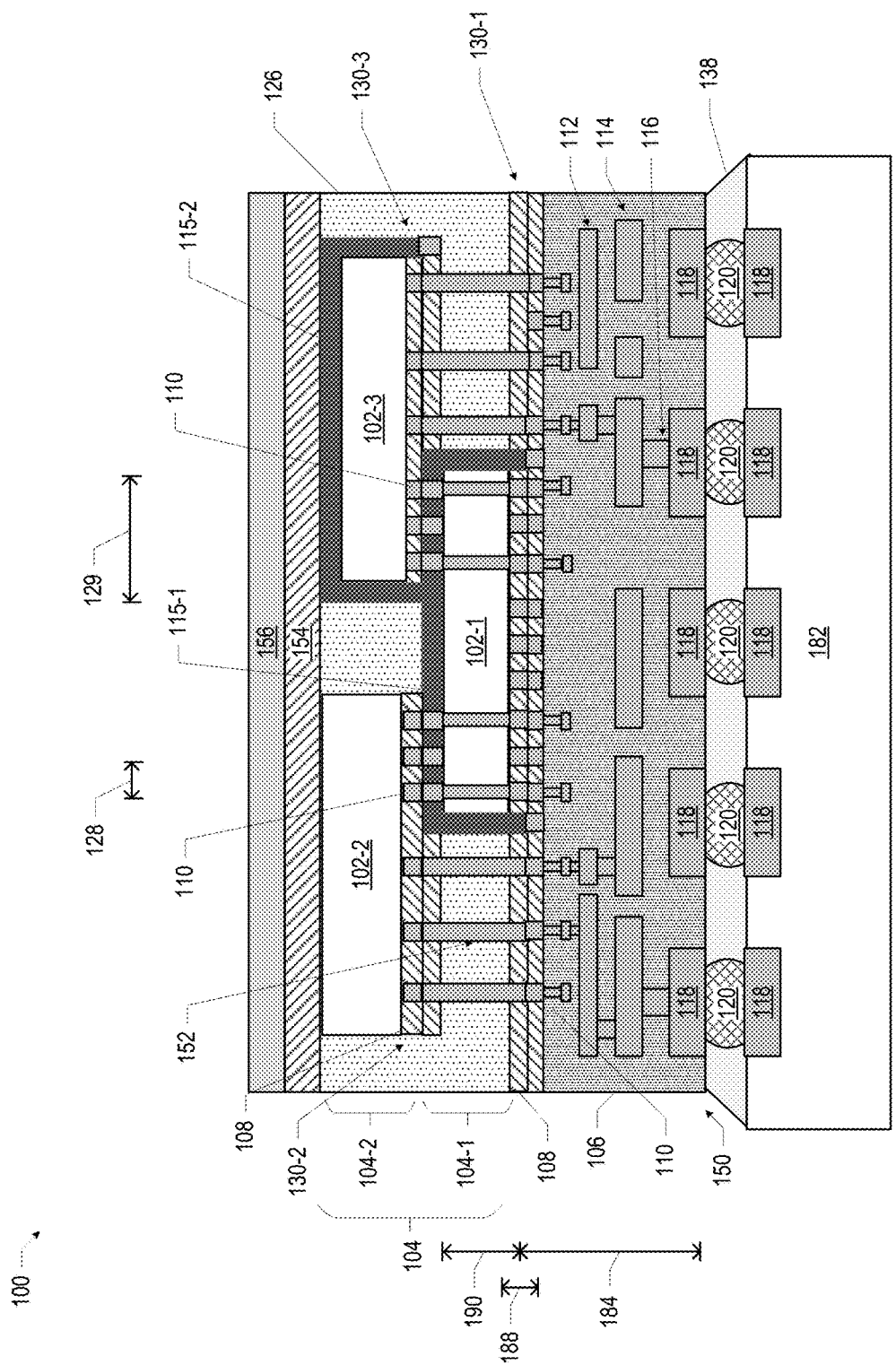
FIG. 1 is a side, cross-sectional view of an example microelectronic assembly including a contiguous shield structure, in accordance with various embodiments.

Microelectronic assemblies, and related devices and methods, are disclosed herein. For example, in some embodiments, a microelectronic assembly may include a first microelectronic component, embedded in a first dielectric layer, including a surface and one or more side surfaces at least partially encapsulated by a first magnetic conductive material; and a second microelectronic component, embedded in a second dielectric layer on the first dielectric layer, including a surface and one or more side surfaces at least partially encapsulated by a second magnetic conductive material, wherein the second microelectronic component is coupled to the surface of the first microelectronic component by a hybrid bonding region, and wherein the second magnetic conductive material is coupled to the first magnetic conductive material.

Communicating large numbers of signals between two or more dies coupled via hybrid bonding in a multi-die IC package is challenging due to the increasingly small size of such dies and reduced thickness of the bonding interface between dies (e.g., z-height of die-to-die spacing), among others. This becomes more difficult for stacking of dies having different operating voltages and frequencies, and for stacking of mixed signal dies (e.g., stacking of a radio frequency (RF) die with a digital die). Conventional approaches seek to reduce signal crosstalk, signal coupling, and insertion loss by increasing the ratio of ground connections to signal connections, which is likely to lower the bandwidth density, increase the die area, and add latency due to the increased signal distance. Other conventional approaches include adding an additional isolation ground layer on a die, which increases cost, size, and yield of the die, or increasing the z-height of the die-to-die spacing, which increases cost and limits interconnect pitch. Another conventional approach includes adding a metal layer on surfaces of a die to shield the die against RF interference. Another conventional approach includes placing an RF victim die (e.g., a die that is affected by RF interference) further away (i.e., at an increased distance) from an RF source die (e.g., a die that generates RF interference), which is increasingly difficult due to reduced IC package size and to increased use of stacking dies. Although all combinations of stacked dies may be modeled for performance, the large number of possible combinations is time and cost prohibitive. Various ones of the microelectronic assemblies disclosed herein may exhibit better signal performance and less crosstalk while reducing the size of the package relative to conventional approaches by providing a contiguous RF shield structure on and around dies to suppress die-to-die signal coupling and RF interference. The microelectronic assemblies disclosed herein may be particularly advantageous for small and low-profile applications in computers, tablets, industrial robots, and consumer electronics (e.g., wearable devices).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. The terms "top," "bottom," etc. may be used herein to explain various features of the drawings, but these terms are simply for ease of discussion, and do not imply a desired or required orientation. As used herein, the term "thickness" refers to a dimension of a certain element or layer as measured along the z-axis, the term "width" refers to a dimension of a certain element or layer as measured along the y-axis, while the term "length" refers to a dimension of a certain element or layer as measured along the x-axis. Although certain elements may be referred to in the singular herein, such elements may include multiple sub-elements. For example, "a dielectric material" may include one or more dielectric materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via). For ease of discussion, the drawings of FIGS. 7A-7G may be referred to herein as "FIG. 7," etc.

FIG. 1 is a side, cross-sectional view of a microelectronic assembly 100, in accordance with various embodiments. The microelectronic assembly 100 may include a multi-layer die subassembly 104 having a contiguous RF shield structure 115. The multi-layer die subassembly 104 may include a first microelectronic component 102-1 having a first RF shield structure 115-1 in a first dielectric layer 104-1 coupled to the interposer 150 via a first hybrid bonding region 130-1, a second microelectronic component 102-2 in a second dielectric layer 104-2 coupled to the first microelectronic component 102-1 via a second hybrid bonding region 130-2, and a third microelectronic component 102-3 having a second RF shield structure 115-2 in the second dielectric layer 104-2 coupled to the first microelectronic component 102-1 via a hybrid bonding region 130-3. As used herein, the terms "RF shield structure," "a magnetic conductive layer," "magnetic conductive material," and variations thereof, may be used interchangeably. The second RF shield structure 115-2 may be coupled (e.g., via hybrid bonding) to the first RF shield structure 115-1 to form a contiguous RF shield structure 115 around the first microelectronic component 102-1, around the third microelectronic component 102-3, and in an overlap portion 129 between the first and third microelectronic components 102-1, 102-3. As used herein, the term "contiguous" means in actual contact or touching along a boundary or at a point. In some embodiments, the overlap portion 129 may be a partial overlap, where the first microelectronic component 102-1 is partially within a footprint (e.g., within the shadow or XY dimension) of the third microelectronic component 102-3, as shown in FIG. 1. In some embodiments, the overlap portion 129 may be a full overlap, where the first microelectronic component 102-1 is wholly within a footprint of the third microelectronic component 102-3 (not shown). The overlap portion 129 of the RF shield structure 115 protects the interface between the first and third microelectronic components 102-1, 102-3, effectively shielding the third microelectronic component 102-3 along at least a portion of the bottom surface, such that RF interference is further minimized.

FIG. 1 illustrates the microelectronic assembly 100 having a first RF shield structure 115-1 on the first microelectronic component 102-1 and a second RF shield structure 115-2 on the third microelectronic component 102-3. An RF shield structure 115 may be formed to at least partially surround a microelectronic component 102 and may be formed to at least partially encapsulate a surface and one or more of the side surfaces of a microelectronic component 102. For example, the microelectronic components 102 may include a top surface, a bottom surface, and one or more side surfaces, where the RF shield structure 115 at least partially covers the top surface and the one or more side surfaces to form a cap or lid that surrounds the microelectronic component on all sides except the bottom side. The RF shield structure 115 may be formed of any suitable magnetic conductive material, such as a ferromagnetic material. In some embodiments, suitable magnetic conductive materials may include a Heusler compound, where the Heusler compound may include any of manganese, iron, cobalt, molybdenum, nickel, copper, vanadium, indium, aluminum, gallium, silicon, germanium, tin, and/or antimony. In some embodiments, suitable magnetic conductive materials may include Heusler alloy, Co, Fe, Ni, permalloy, or yttrium iron garnet (YIG), where the Heusler alloy is a material which includes one or more of: Cu, Mn, Ni, Co, Fe, $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, MnGaRu, or $Mn_3X$, where 'X' is one of Ga or Ge. In some embodiments, suitable magnetic conductive materials may include FeO, $Fe_2O_3$, Nd, $Nd_2O_3$, Pr, Sm, $Sm_2O_3$, Tb, $Tb_2O_3$, Tm, or $Tm_2O_3$, among others. The RF shield structure 115 may be formed using any suitable process, including, for example, by sputtering, atomic layer deposition (ALD), by chemical vapor deposition (CVD), by plasma-enhanced chemical vapor deposition (PECVD), by laminating, or by growing the magnetic conductive layer on the microelectronic component 102. In some embodiments, the RF shield structure 115 may be coated with an inorganic dielectric, such as silicon and nitrogen (e.g., in the form of silicon nitride), silicon and oxygen (e.g., in the form of silicon oxide), or silicon, carbon, and nitrogen (e.g., in the form of silicon carbonitride), to protect the magnetic conductive material and improve subsequent process adhesion. The RF shield structure 115 may be a continuous structure with openings on the top surface that expose the HB contacts 110. The RF shield structure 115 may have any suitable dimensions to reduce RF interference. The RF shield structure 115 may have any suitable thickness (i.e., an x-dimension or a y-dimension for a side surface, or a z-height for a top surface), for example, a thickness between 0.05 microns and 2 millimeters. In some embodiments, the RF shield structure 115 may be coupled to a ground connection on the interposer 150 (e.g., the RF shield structure may be coupled to a ground plane in a package substrate).

The RF shield structure 115 may be formed to protect an RF-affected microelectronic component (i.e., an RF victim) from RF interference and/or to mitigate RF interference from an RF-generating microelectronic component (i.e., an RF source). An RF-generating microelectronic component 102 may include a die or stacked die architectures that have RF-generating elements, such as an inductor, a capacitor, an antenna, a coil, a voltage regulator, input/output circuitry, or RF circuitry (e.g., a modem or a WiFi device). In FIG. 1, for example, the first and second microelectronic components 102-1, 102-2 may be RF-affected components and the third microelectronic component 102-3 may be an RF-generating component, where the RF shield structure 115 (e.g., the coupled first and second RF shield structures 115-1, 115-2) protects the first microelectronic component 102-1 (and the second microelectronic component 102-2) from RF interference generated by the third microelectronic component 102-3. In another example, the first and third microelectronic components 102-1, 102-3 may be RF-affected components and the second microelectronic component 102-2 may be an RF-generating component, where the RF shield structure 115 (e.g., the coupled first and second RF shield structures 115-1, 115-2) protects the first and third microelectronic components 102-1, 102-3 from RF interference generated by the second microelectronic component 102-2. In yet another example, the second microelectronic component 102-2 may be an RF-affected component and the first and third microelectronic components 102-1, 102-3 may be RF-generating components, where the RF shield structure 115 (e.g., the coupled first and second RF shield structures 115-1, 115-2) protects the second microelectronic component 102-2 from RF interference generated by the first and third microelectronic components 102-1, 102-3. In some embodiments, the RF shield structure 115 may be designed to act as a ground plane for improved RF and power delivery performance. Although FIG. 1 illustrates two RF shield structures 115-1, 115-2, a microelectronic assembly 100 may include any number of RF shield structures coupled together to form a contiguous RF shield structure 115 (e.g., three or more RF shield structures).

As used herein, the term a "multi-layer die subassembly" 104 may refer to a composite die having two or more stacked dielectric layers with one or more dies in each layer, and conductive interconnects and/or conductive pathways connecting the one or more dies, including dies in non-adjacent layers. As used herein, the terms a "multi-layer die subassembly" and a "composite die" may be used interchangeably. As used herein, the term "multi-level interconnect" 152 may refer to an interconnect that includes a conductive pillar between a first component and a second component where the first component and the second component are not in adjacent layers, or may refer to an interconnect that spans one or more layers (e.g., an interconnect between a first die in a first layer and a second die in a third layer, or an interconnect between a package substrate and a die in a second layer). As shown in FIG. 1, the multi-layer die subassembly 104 may include two layers. In particular, the multi-layer die subassembly 104 may include a first layer 104-1 having a microelectronic component 102-1, and a second layer 104-2 having a microelectronic component 102-2 and a microelectronic component 102-3. The microelectronic components 102-2, 102-3 in the second layer 104-2 may be coupled to the package substrate via the conductive pillars 152 to form multi-level (ML) interconnects. The ML interconnects may be power delivery interconnects or high speed signal interconnects.

The microelectronic assembly 100 may include the multi-layer die subassembly 104 having a contiguous RF shield structure 115 coupled to an interposer 150 with an insulating material 106. The microelectronic assembly 100 may further include a mold material 126, a support component 182, an underfill material 138, a heat transfer structure 156, and a thermal interface material (TIM) 154. A number of elements are illustrated in FIG. 1 as included in the microelectronic assembly 100, but a number of these elements may not be present in a microelectronic assembly 100. For example, in various embodiments, the mold material 126, the underfill material 138, the support component 182, the underfill material 138, the heat transfer structure 156, and/or the thermal interface material (TIM) 154 may not be included. Further, FIG. 1 illustrates a number of elements that are omitted from subsequent drawings for ease of illustration, but may be included in any of the microelectronic assemblies 100 disclosed herein. Examples of such elements include the mold material 126, the underfill material 138, the support component 182, the underfill material 138, the heat transfer structure 156, and/or the thermal interface material (TIM) 154. Many of the elements of the microelectronic assembly 100 of FIG. 1 are included in other ones of the accompanying drawings; the discussion of these elements is not repeated when discussing these drawings, and any of these elements may take any of the forms disclosed herein. In some embodiments, individual ones of the microelectronic assemblies 100 disclosed herein may serve as a system-in-package (SiP) in which multiple microelectronic components 102 having different functionality are included. In such embodiments, the microelectronic assembly 100 may be referred to as an SiP.

Figure 2:
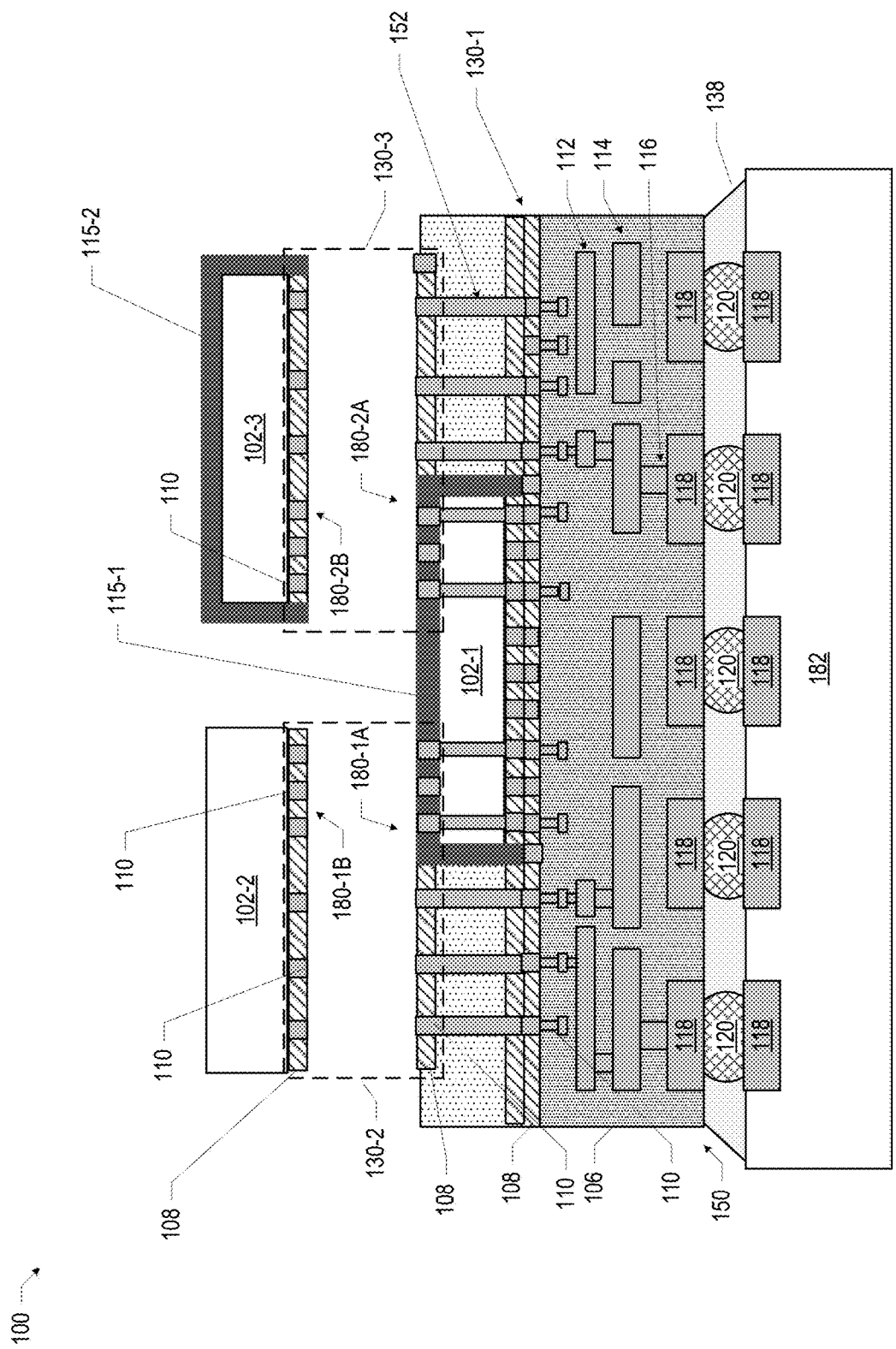
FIG. 2 is a side, cross-sectional exploded view of a portion of the microelectronic assembly of FIG. 1, in accordance with various embodiments.

The microelectronic assembly 100 may include a second microelectronic component 102-2 coupled to a first microelectronic component 102-1 by a hybrid bonding (HB) region 130-2. In particular, as illustrated in FIG. 2, the HB region 130-2 may include a HB interface 180-1A at the top surface of the first microelectronic component 102-1, with the HB interface 180-1A including a set of conductive HB contacts 110 and a HB dielectric 108 around the HB contacts 110 of the HB interface 180-1A. The HB region 130-2 may also include a HB interface 180-1B at the bottom surface of the microelectronic component 102-2, with the HB interface 180-1B including a set of HB contacts 110 and a HB dielectric 108 around the HB contacts 110 of the HB interface 180-1B. The HB contacts 110 of the HB interface 180-1A of the microelectronic component 102-1 may align with the HB contacts 110 of the HB interface 180-1B of the microelectronic component 102-2 so that, in the microelectronic assembly 100, the HB contacts 110 of the microelectronic component 102-2 are in contact with the HB contacts 110 of the microelectronic component 102-1. In the microelectronic assembly 100 of FIG. 1, the HB interface 180-1A of the microelectronic component 102-1 may be bonded (e.g., electrically and mechanically) with the HB interface 180-1B of the microelectronic component 102-2 to form the HB region 130-2 coupling the microelectronic component 102-1 and the microelectronic component 102-2.

The microelectronic assembly 100 may further include a third microelectronic component 102-3 coupled to a first microelectronic component 102-1 by a hybrid bonding (DB) region 130-3. In particular, as illustrated in FIG. 2, the HB region 130-3 may include a HB interface 180-2A at the top surface of the first microelectronic component 102-1, with the HB interface 180-2A including a set of conductive HB contacts 110 and a HB dielectric 108 around the HB contacts 110 of the HB interface 180-2A. The HB region 130-3 may also include a HB interface 180-2B at the bottom surface of the microelectronic component 102-3, with the HB interface 180-2B including a set of HB contacts 110 and a HB dielectric 108 around the HB contacts 110 of the HB interface 180-2B. The HB contacts 110 of the HB interface 180-2A of the microelectronic component 102-1 may align with the HB contacts 110 of the HB interface 180-2B of the microelectronic component 102-3 so that, in the microelectronic assembly 100, the HB contacts 110 of the microelectronic component 102-3 are in contact with the HB contacts 110 of the microelectronic component 102-1. In the microelectronic assembly 100 of FIG. 1, the HB interface 180-2A of the microelectronic component 102-1 may be bonded (e.g., electrically and mechanically) with the HB interface 180-2B of the microelectronic component 102-3 to form the HB region 130-3 coupling the microelectronic component 102-1 and the microelectronic component 102-3. More generally, the HB regions 130 disclosed herein may include two complementary HB interfaces 180 bonded together; for ease of illustration, many of the subsequent drawings may omit the identification of the HB interfaces 180 to improve the clarity of the drawings.

As used herein, the term "hybrid bonding" is used to include techniques in which the HB dielectric 108 of opposing HB interfaces 180 are brought into contact first, then subject to heat and sometimes compression, or techniques in which the HB contacts 110 and the HB dielectric 108 of opposing HB interfaces 180 are brought into contact substantially simultaneously, then subject to heat and compression. In such techniques, the HB contacts 110 and the HB dielectric 108 at one HB interface 180 are brought into contact with the HB contacts 110 and the HB dielectric 108 at another HB interface 180, respectively, and elevated pressures and/or temperatures may be applied to cause the contacting HB contacts 110 and/or the contacting HB dielectrics 108 to bond. In some embodiments, this bond may be achieved without the use of intervening solder or an anisotropic conductive material, while in some other embodiments, a thin cap of solder may be used in a HB interconnect to accommodate planarity, and this solder may become an intermetallic compound (IMC) in the HB region 130 during processing. HB interconnects may be capable of reliably conducting a higher current than other types of interconnects; for example, some conventional solder interconnects may form large volumes of brittle IMCs when current flows, and the maximum current provided through such interconnects may be constrained to mitigate mechanical failure. Although FIGS. 1 and 2 show the HB dielectric 108 as extending along the bottom surfaces of the second and third microelectronic components 102-2, 102-3, the HB dielectric 108 may extend fully along the entire top surface of the first dielectric layer 104-1. Although FIGS. 1 and 2 show the HB dielectric 108 as extending fully along the entire top surface of the interposer 150, in some embodiments, the HB dielectric 108 may extend only along a portion of the top surface of the interposer 150, such that the HB dielectric 108 is only within the HB region 130.

A HB dielectric 108 may include one or more dielectric materials, such as one or more inorganic dielectric materials. For example, a HB dielectric 108 may include silicon and nitrogen (e.g., in the form of silicon nitride); silicon and oxygen (e.g., in the form of silicon oxide); silicon, carbon, and nitrogen (e.g., in the form of silicon carbonitride); carbon and oxygen (e.g., in the form of a carbon-doped oxide); silicon, oxygen, and nitrogen (e.g., in the form of silicon oxynitride); aluminum and oxygen (e.g., in the form of aluminum oxide); titanium and oxygen (e.g., in the form of titanium oxide); hafnium and oxygen (e.g., in the form of hafnium oxide); silicon, oxygen, carbon, and hydrogen (e.g., in the form of tetraethyl orthosilicate (TEOS)); zirconium and oxygen (e.g., in the form of zirconium oxide); niobium and oxygen (e.g., in the form of niobium oxide); tantalum and oxygen (e.g., in the form of tantalum oxide); and combinations thereof.

A HB contact 110 may include a pillar, a pad, or other structure. The HB contacts 110, although depicted in the accompanying drawings in the same manner at both HB interfaces 180 of a HB region 130, may have a same structure at both HB interfaces 180, or the HB contacts 110 at different HB interfaces 180 may have different structures. For example, in some embodiments, a HB contact 110 in one HB interface 180 may include a metal pillar (e.g., a copper pillar), and a complementary HB contact 110 in a complementary HB interface 180 may include a metal pad (e.g., a copper pad) recessed in a dielectric. A HB contact 110 may include any one or more conductive materials, such as copper, manganese, titanium, gold, silver, palladium, nickel, copper and aluminum (e.g., in the form of a copper aluminum alloy), tantalum (e.g., tantalum metal, or tantalum and nitrogen in the form of tantalum nitride), cobalt, cobalt and iron (e.g., in the form of a cobalt iron alloy), or any alloys of any of the foregoing (e.g., copper, manganese, and nickel in the form of manganin). In some embodiments, the HB dielectric 108 and the HB contacts 110 of a HB interface 180 may be manufactured using low-temperature deposition techniques (e.g., techniques in which deposition occurs at temperatures below 250 degrees Celsius, or below 200 degrees Celsius), such as low-temperature PECVD.

FIGS. 1 and 2 also illustrate the microelectronic component 102-1 coupled to the interposer 150 by a HB region 130-1. Although FIG. 1 depicts a particular number of microelectronic components 102 coupled to the interposer 150 and to other microelectronic components 102 by HB regions 130, this number and arrangement are simply illustrative, and a microelectronic assembly 100 may include any desired number and arrangement of microelectronic components 102 coupled to an interposer 150 and to other microelectronic components 102 by HB regions 130. Although a single reference numeral "108" is used to refer to the HB dielectrics of multiple different HB interfaces 180 (and different HB regions 130), this is simply for ease of illustration, and the HB dielectric 108 of different HB interfaces 180 (even within a single HB region 130) may have different materials and/or structures. Similarly, although a single reference numeral "110" is used to refer to the HB contacts of multiple different HB interfaces 180 (and different HB regions 130), this is simply for ease of illustration, and the HB contacts 110 of different HB interfaces 180 (even within a single HB region 130) may have different materials and/or structures.

The interposer 150 may include an insulating material 106 (e.g., one or more dielectric materials formed in multiple layers, as known in the art) and one or more conductive pathways 112 through the insulating material 106 (e.g., including conductive lines 114 and/or conductive vias 116, as shown). In some embodiments, the insulating material 106 of the interposer 150 includes an inorganic dielectric material, such as silicon and nitrogen (e.g., in the form of silicon nitride); silicon and oxygen (e.g., in the form of silicon oxide); silicon and carbon (e.g., in the form of silicon carbide); silicon, carbon, and oxygen (e.g., in the form of silicon oxycarbide); silicon, carbon, and nitrogen (e.g., in the form of silicon carbonitride); carbon and oxygen (e.g., in the form of a carbon-doped oxide); silicon, oxygen, and nitrogen (e.g., in the form of silicon oxynitride); or silicon, oxygen, carbon, and hydrogen (e.g., in the form of tetraethyl orthosilicate (TEOS)); and combinations thereof. In some embodiments, the insulating material 106 of the interposer 150 includes an insulating metal oxide, such as aluminum and oxygen (e.g., in the form of aluminum oxide); titanium and oxygen (e.g., in the form of titanium oxide); hafnium and oxygen (e.g., in the form of hafnium oxide); zirconium and oxygen (e.g., in the form of zirconium oxide); niobium and oxygen (e.g., in the form of niobium oxide); or tantalum and oxygen (e.g., in the form of tantalum oxide); and combinations thereof. In some embodiments, the interposer 150 may be semiconductor-based (e.g., silicon-based) or glass-based. In some embodiments, the interposer 150 is a silicon wafer or die. In some embodiments, the interposer 150 may be a silicon-on-insulator (SOI) and may further include layers of silicon and germanium (e.g., in the form of silicon germanium), gallium and nitrogen (e.g., in the form of gallium nitride), indium and phosphorous (e.g., in the form of indium phosphide), among others. In some embodiments, the insulating material 106 of the interposer 150 may be an organic material, such as polyimide or polybenzoxazole, or may include an organic polymer matrix (e.g., epoxide) with a filler material (which may be inorganic, such as silicon nitride, silicon oxide, or aluminum oxide). In some such embodiments, the interposer 150 may be referred to as an "organic interposer." In some embodiments, the insulating material 106 of an interposer 150 may be provided in multiple layers of organic buildup film. Organic interposers 150 may be less expensive to manufacture than semiconductor- or glass-based interposers, and may have electrical performance advantages due to the low dielectric constants of organic insulating materials 106 and the thicker lines that may be used (allowing for improved power delivery, signaling, and potential thermal benefits). Organic interposers 150 may also have larger footprints than can be achieved for semiconductor-based interposers, which are limited by the size of the reticle used for patterning. Further, organic interposers 150 may be subject to less restrictive design rules than those that constrain semiconductor- or glass-based interposers, allowing for the use of design features such as non-Manhattan routing (e.g., not being restricted to using one layer for horizontal interconnects and another layer for vertical interconnects) and the avoidance of through-substrate vias (TSVs) such as through-silicon vias or through-glass vias (which may be limited in the achievable pitch, and may result in less desirable power delivery and signaling performance). Conventional integrated circuit packages including an organic interposer have been limited to solder-based attach technologies, which may have a lower limit on the achievable pitch that precludes the use of conventional solder-based interconnects to achieve the fine pitches desired for next generation devices. Utilizing an organic interposer 150 in a microelectronic assembly 100 with hybrid bonding, as disclosed herein, may leverage these advantages of organic interposers in combination with the ultra-fine pitch (e.g., the pitch 128 discussed below) achievable by hybrid bonding (and previously only achievable when using semiconductor-based interposers), and thus may support the design and fabrication of large and sophisticated die complexes that can achieve packaged system competition performance and capabilities not enabled by conventional approaches.

In other embodiments, the insulating material 106 of the interposer 150 may include a fire retardant grade 4 material (FR-4), bismaleimide triazine (BT) resin, or low-k or ultra low-k dielectric (e.g., carbon-doped dielectrics, fluorine-doped dielectrics, and porous dielectrics). When the interposer 150 is formed using standard printed circuit board (PCB) processes, the insulating material 106 may include FR-4, and the conductive pathways 112 in the interposer 150 may be formed by patterned sheets of copper separated by buildup layers of the FR-4. In some such embodiments, the interposer 150 may be referred to as a "package substrate" or a "circuit board."

In some embodiments, one or more of the conductive pathways 112 in the interposer 150 may extend between a conductive contact at the top surface of the interposer 150 (e.g., one of the HB contacts 110) and a conductive contact 118 at the bottom surface of the interposer 150. In some embodiments, one or more of the conductive pathways 112 in the interposer 150 may extend between different conductive contacts at the top surface of the interposer 150 (e.g., between different HB contacts 110 potentially in different HB regions 130). In some embodiments, one or more of the conductive pathways 112 in the interposer 150 may extend between different conductive contacts 118 at the bottom surface of the interposer 150.

In some embodiments, an interposer 150 may only include conductive pathways 112, and may not contain active or passive circuitry. In other embodiments, an interposer 150 may include active or passive circuitry (e.g., transistors, diodes, resistors, inductors, and capacitors, among others). In some embodiments, an interposer 150 may include one or more device layers including transistors.

Although FIGS. 1 and 2 (and others of the accompanying drawings) illustrate a specific number and arrangement of conductive pathways 112 in the interposer 150, these are simply illustrative, and any suitable number and arrangement may be used. The conductive pathways 112 disclosed herein (e.g., including lines 114 and/or vias 116) may be formed of any appropriate conductive material, such as copper, silver, nickel, gold, aluminum, other metals or alloys, or combinations of materials, for example.

In some embodiments, a microelectronic component 102 may include an IC die (packaged or unpackaged) or a stack of an IC dies (e.g., a high-bandwidth memory dies stack). In some such embodiments, the insulating material of a microelectronic component 102 may include silicon dioxide, silicon nitride, oxynitride, polyimide materials, glass-reinforced epoxy matrix materials, or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). In some further embodiments, the insulating material of a microelectronic component 102 may include a semiconductor material, such as silicon, germanium, or a III-V material (e.g., gallium nitride), and one or more additional materials. For example, an insulating material of a microelectronic component 102 may include silicon oxide or silicon nitride. The conductive pathways in a microelectronic component 102 may include conductive lines and/or conductive vias, and may connect any of the conductive contacts in the microelectronic component 102 in any suitable manner (e.g., connecting multiple conductive contacts on a same surface or on different surfaces of the microelectronic component 102). Example structures that may be included in the microelectronic components 102 disclosed herein are discussed below with reference to FIG. 9. In particular, a microelectronic component 102 may include active and/or passive circuitry (e.g., transistors, diodes, resistors, inductors, and capacitors, among others). In some embodiments, a microelectronic component 102 may include one or more device layers including transistors. When a microelectronic component 102 includes active circuitry, power and/or ground signals may be routed through the interposer 150 and to/from a microelectronic component 102 through a HB region 130 (and further through intervening microelectronic components 102). In some embodiments, a microelectronic component 102 may take the form of any of the embodiments of the interposer 150 herein. The microelectronic components 102 of the microelectronic assembly 100 of FIG. 1 may be single-sided components, in the sense that an individual microelectronic components 102 only have conductive contacts (e.g., HB contacts 110) on a single surface of the individual microelectronic components 102 (e.g., microelectronic components 102-2, 102-3), or may be double-sided (or "multi-level," or "omni-directional") components with conductive contacts on multiple surfaces of the component (e.g., microelectronic component 102-1).

Additional components (not shown), such as surface-mount resistors, capacitors, and/or inductors, may be disposed on the top surface or the bottom surface of the interposer 150, or embedded in the interposer 150. The microelectronic assembly 100 of FIG. 1 also includes a support component 182 coupled to the interposer 150. In the particular embodiment of FIG. 1, the support component 182 includes conductive contacts 118 that are electrically coupled to complementary conductive contacts 118 of the interposer 150 by intervening solder 120 (e.g., solder balls in a ball grid array (BGA) arrangement), but any suitable interconnect structures may be used (e.g., pins in a pin grid array arrangement, lands in a land grid array arrangement, pillars, pads and pillars, etc.). The solder 120 utilized in the microelectronic assemblies 100 disclosed herein may include any suitable materials, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, the couplings between the interposer 150 and the support component 182 may be referred to as second-level interconnects (SLI) or multi-level interconnects (MLI).

In some embodiments, the support component 182 may be a package substrate (e.g., may be manufactured using PCB processes, as discussed above). In some embodiments, the support component 182 may be a circuit board (e.g., a motherboard), and may have other components attached to it (not shown). The support component 182 may include conductive pathways and other conductive contacts (not shown) for routing power, ground, and signals through the support component 182, as known in the art. In some embodiments, the support component 182 may include another IC package, an interposer, or any other suitable component. An underfill material 138 may be disposed around the solder 120 coupling the interposer 150 to the support component 182. In some embodiments, the underfill material 138 may include an epoxy material.

In some embodiments, the support component 182 may be a lower density component, while the interposer 150 and/or the microelectronic components 102 may be higher density components. As used herein, the term "lower density" and "higher density" are relative terms indicating that the conductive pathways (e.g., including conductive lines and conductive vias) in a lower density component are larger and/or have a greater pitch than the conductive pathways in a higher density component. In some embodiments, a microelectronic component 102 may be a higher density component, and an interposer 150 may be a lower density component. In some embodiments, a higher density component may be manufactured using a dual damascene or single damascene process (e.g., when the higher density component is a die), while a lower density component may be manufactured using a semi-additive or modified semi-additive process (with small vertical interconnect features formed by advanced laser or lithography processes) (e.g., when the lower density component is a package substrate or an interposer). In some other embodiments, a higher density component may be manufactured using a semi-additive or modified semi-additive process (e.g., when the higher density component is a package substrate or an interposer), while a lower density component may be manufactured using a semi-additive or a subtractive process (using etch chemistry to remove areas of unwanted metal, and with coarse vertical interconnect features formed by a standard laser process) (e.g., when the lower density component is a PCB).

The microelectronic assembly 100 of FIG. 1 may also include a mold material 126. The mold material 126 may extend around one or more of the microelectronic components 102 on the interposer 150. In some embodiments, the mold material 126 may extend between multiple microelectronic components 102 on the interposer 150 and around the HB regions 130. In some embodiments, the mold material 126 may extend above one or more of the microelectronic components 102 on an interposer 150 (not shown). The mold material 126 may be an insulating material, such as an appropriate epoxy material. The mold material 126 may be selected to have a coefficient of thermal expansion (CTE) that may mitigate or minimize the stress between the microelectronic components 102 and the interposer 150 arising from uneven thermal expansion in the microelectronic assembly 100. In some embodiments, the CTE of the mold material 126 may have a value that is intermediate to the CTE of the interposer 150 (e.g., the CTE of the insulating material 106 of the interposer 150) and a CTE of the microelectronic components 102. In some embodiments, the mold material 126 used in a microelectronic assembly 100 may be selected at least in part for its thermal properties. For example, one or more mold materials 126 used in a microelectronic assembly 100 may have low thermal conductivity (e.g., conventional mold compounds) to retard heat transfer, or may have high thermal conductivity (e.g., mold materials including metal or ceramic particles with high thermal conductivity, such as copper, silver, diamond, silicon carbide, aluminum nitride, and boron nitride, among others) to facilitate heat transfer. Any of the mold materials 126 referred to herein may include one or more different materials with different material compositions.

The microelectronic assembly 100 of FIG. 1 may also include a TIM 154. The TIM 154 may include a thermally conductive material (e.g., metal particles) in a polymer or other binder. The TIM 154 may be a thermal interface material paste or a thermally conductive epoxy (which may be a fluid when applied and may harden upon curing, as known in the art). The TIM 154 may provide a path for heat generated by the microelectronic components 102 to readily flow to the heat transfer structure 156, where it may be spread and/or dissipated. Some embodiments of the microelectronic assembly 100 of FIG. 1 may include a sputtered metallization (not shown) across the top surfaces of the mold material 126 and the microelectronic components 102; the TIM 154 (e.g., a solder TIM) may be disposed on this metallization.

The microelectronic assembly 100 of FIG. 1 may also include a heat transfer structure 156. The heat transfer structure 156 may be used to move heat away from one or more of the microelectronic components 102 (e.g., so that the heat may be more readily dissipated). The heat transfer structure 156 may include any suitable thermally conductive material (e.g., metal, appropriate ceramics, etc.), and may include any suitable features (e.g., a heat spreader, a heat sink including fins, a cold plate, etc.). In some embodiments, a heat transfer structure 156 may be or may include an integrated heat spreader (IHS).

The elements of a microelectronic assembly 100 may have any suitable dimensions. Only a subset of the accompanying drawings are labeled with reference numerals representing dimensions, but this is simply for clarity of illustration, and any of the microelectronic assemblies 100 disclosed herein may have components having the dimensions discussed herein. In some embodiments, the thickness 184 of the interposer 150 may be between 20 microns and 200 microns. In some embodiments, the thickness 188 of a HB region 130 may be between 50 nanometers and 5 microns. In some embodiments, a thickness 190 of a microelectronic component 102 may be between 5 microns and 800 microns. In some embodiments, a pitch 128 of the HB contacts 110 in a HB region 130 may be less than 20 microns (e.g., between 0.1 microns and 20 microns).

Figure 3:
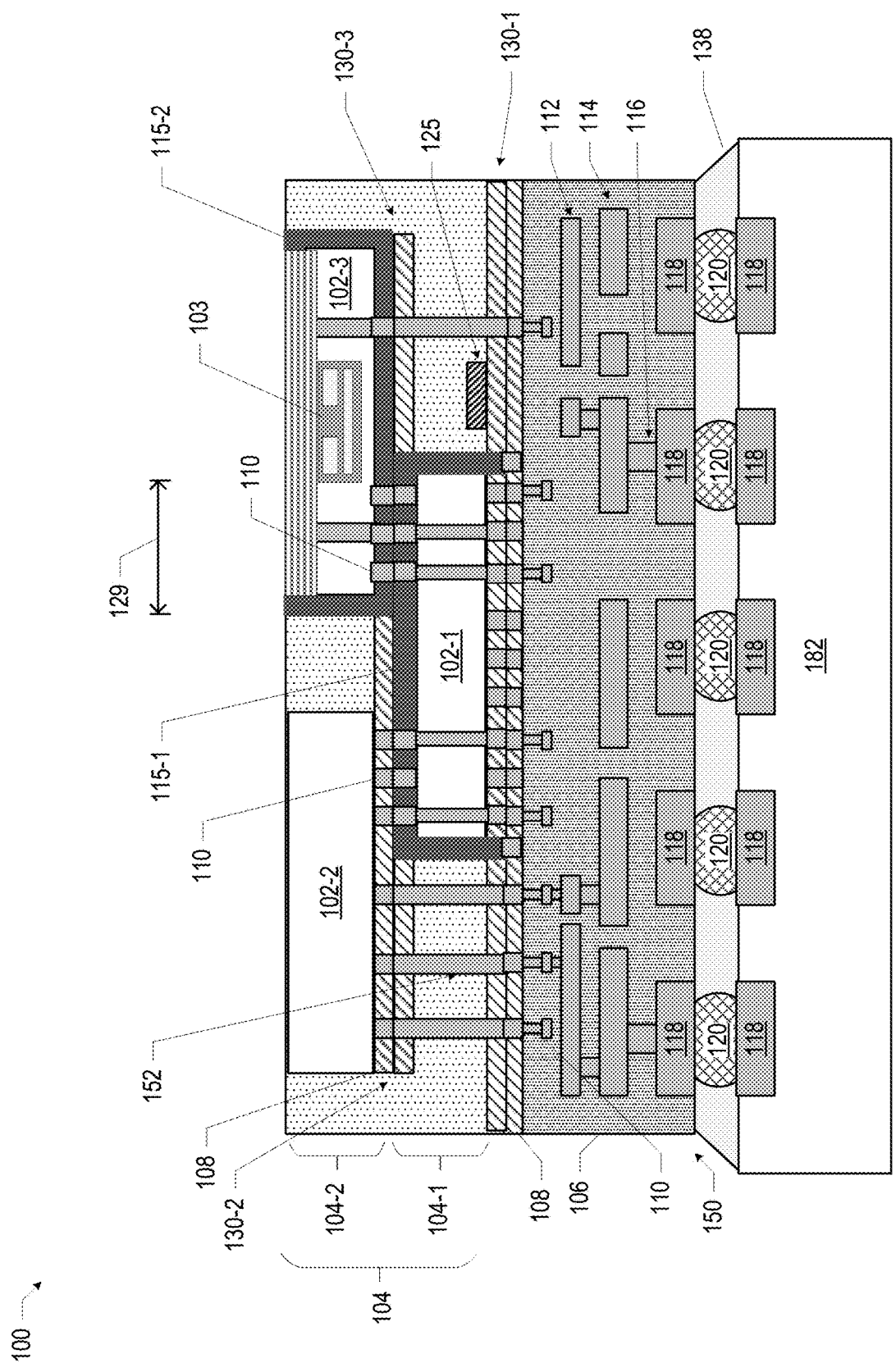
FIG. 3 is a side, cross-sectional view of an example microelectronic assembly including a contiguous shield structure, in accordance with various embodiments.

FIG. 3 is a side, cross-sectional view of an example microelectronic assembly 100, in accordance with various embodiments. The microelectronic assembly 100 may include a multi-layer die subassembly 104 having a contiguous shield structure 115. The multi-layer die subassembly 104 may include a first microelectronic component 102-1 having a first RF shield structure 115-1 in a first dielectric layer 104-1 coupled to the interposer 150 via a first hybrid bonding region 130-1, a second microelectronic component 102-2 in a second dielectric layer 104-2 coupled to the first microelectronic component 102-1 via a second hybrid bonding region 130-2, and a third microelectronic component 102-3, that includes an RF-generating element 103, having a second RF shield structure 115-2 in the second dielectric layer 104-2 coupled to the first microelectronic component 102-1 via a hybrid bonding region 130-3. The microelectronic assembly 100 may further include a transmission line 125 in the first dielectric layer 104-1 and within a footprint of the third microelectronic component 102-3. For example, the transmission line 125 may include a pair of side-by-side transmission lines or may include one or more transmission lines coupled to a ground plane in the interposer or a package substrate (not shown). The first and second microelectronic components 102-1, 102-2 and the transmission line 125 may be RF-affected components. The first RF shield structure 115-1 may cover the top surface and the side surfaces of the first microelectronic component 102-1. The second RF shield structure 115-2 may cover the bottom surface and the one or more side surfaces of the third microelectronic component 102-3 (e.g., the third microelectronic component 102-3 may be inverted before being hybrid bonded to the first microelectronic component 102-1). The second RF shield structure 115-2 may be coupled (e.g., via hybrid bonding) to the first RF shield structure 115-1 to form a contiguous RF shield structure 115 around the top and side surfaces of the first microelectronic component 102-1, around the bottom surface and side surfaces of the third microelectronic component 102-3, and in an overlap portion 129 between the first and third microelectronic components 102-1, 102-3. The overlap portion 129 of the RF shield structure 115 protects the interface between the first and third microelectronic components 102-1, 102-3, effectively shielding the first microelectronic component 102-1 from RF interference generated by the third microelectronic component 102-3. The contiguous RF shield structure 115 formed along the top and side surfaces of the first microelectronic component 102-1 and along the bottom and side surfaces of the third microelectronic component 102-3 further protects the transmission line 125 from RF interference generated by the third microelectronic component 102-3. In some embodiments, the first microelectronic component 102-1 may include an RF-generating component (not shown).

Figure 4:
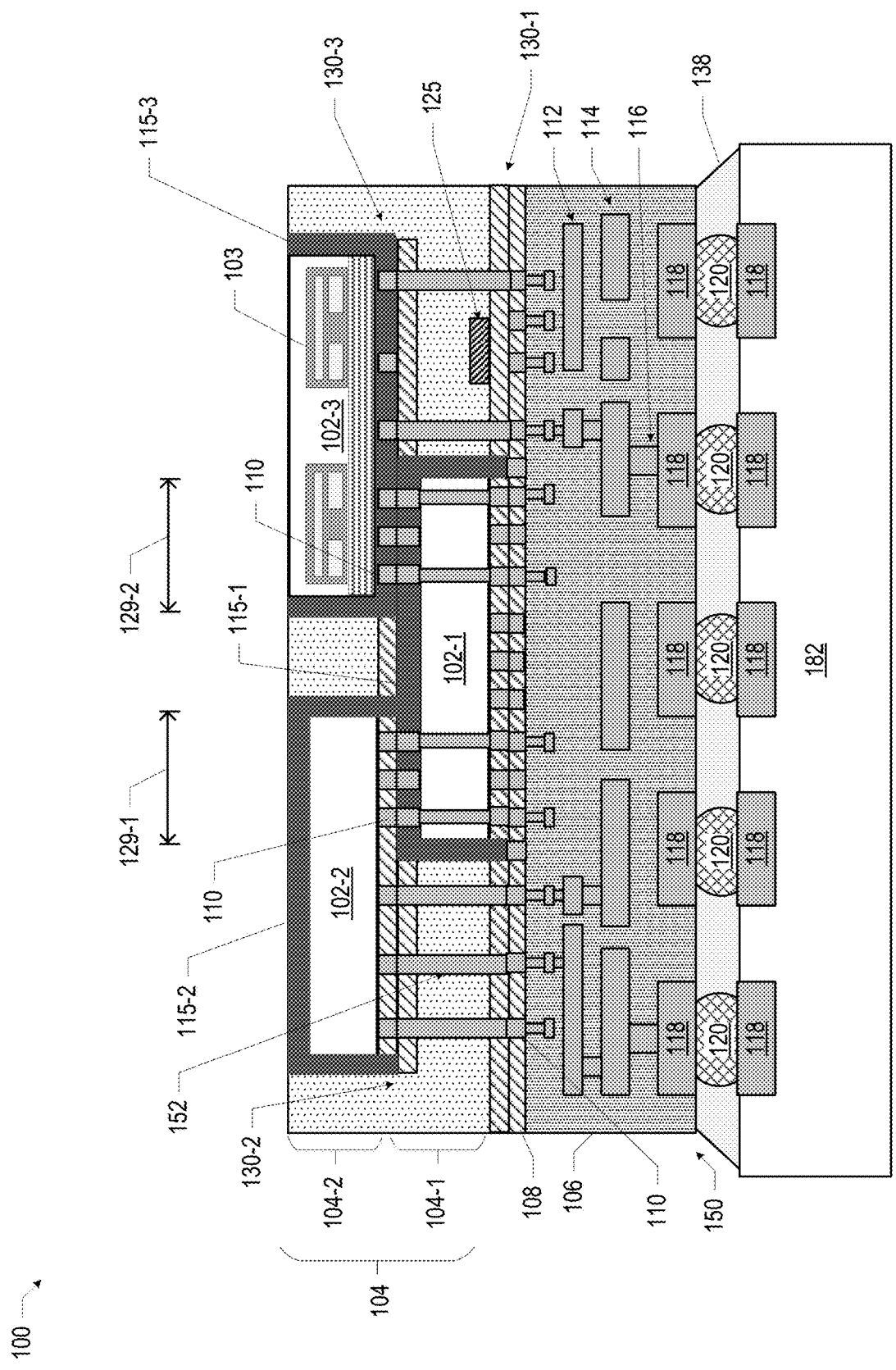
FIG. 4 is a side, cross-sectional view of an example microelectronic assembly including a contiguous shield structure, in accordance with various embodiments.

FIG. 4 is a side, cross-sectional view of an example microelectronic assembly 100, in accordance with various embodiments. The microelectronic assembly 100 may include a multi-layer die subassembly 104 having a contiguous shield structure 115. The multi-layer die subassembly 104 may include a first microelectronic component 102-1 having a first RF shield structure 115-1 in a first dielectric layer 104-1 coupled to the interposer 150 via a first hybrid bonding region 130-1, a second microelectronic component 102-2 having a second RF shield structure 115-2 in a second dielectric layer 104-2 coupled to the first microelectronic component 102-1 via a second hybrid bonding region 130-2, and a third microelectronic component 102-3, that includes an RF-generating element 103, having a third RF shield structure 115-3 in the second dielectric layer 104-2 coupled to the first microelectronic component 102-1 via a hybrid bonding region 130-3. Examples of the RF-generating element 103 may include a component that produces RF interference such as an RF structure, an inductor, or a transformer. The microelectronic assembly 100 may further include a transmission line 125 within a footprint of the third microelectronic component 102-3. The first and second microelectronic components 102-1, 102-2 and the transmission line 125 may be RF-affected components. The first RF shield structure 115-1 may cover the top surface and the side surfaces of the first microelectronic component 102-1. The second RF shield structure 115-2 may cover the top surface and the side surfaces of the second microelectronic component 102-2. The third RF shield structure 115-3 may cover the bottom surface and the side surfaces of the third microelectronic component 102-3 (e.g., the third microelectronic component 102-3 may be inverted before being hybrid bonded to the first microelectronic component 102-1). The first RF shield structure 115-1 may be coupled (e.g., via hybrid bonding) to the second and third RF shield structures 115-2, 115-3 to form a contiguous RF shield structure 115 around the top and side surfaces of the first and second microelectronic components 102-1, 102-2, around the bottom surface and side surfaces of the third microelectronic component 102-3, in a first overlap portion 129-1 between the first and second microelectronic components 102-1, 102-2, and in a second overlap portion 129-2 between the first and third microelectronic components 102-1, 102-3. The overlap portions 129 of the RF shield structure 115 protects the interface between the first and second microelectronic components 102-1, 102-2 and the first and third microelectronic components 102-1, 102-3, effectively shielding the first and second microelectronic components 102-1, 102-2 from RF interference generated by the third microelectronic component 102-3. The contiguous RF shield structure 115 formed along the top and side surfaces of the first microelectronic component 102-1 and along the bottom and side surfaces of the third microelectronic component 102-3 further protects the transmission line 125 from RF interference generated by the third microelectronic component 102-3. In some embodiments, the first microelectronic component 102-1 may include an RF-generating component (not shown).

Figure 5:
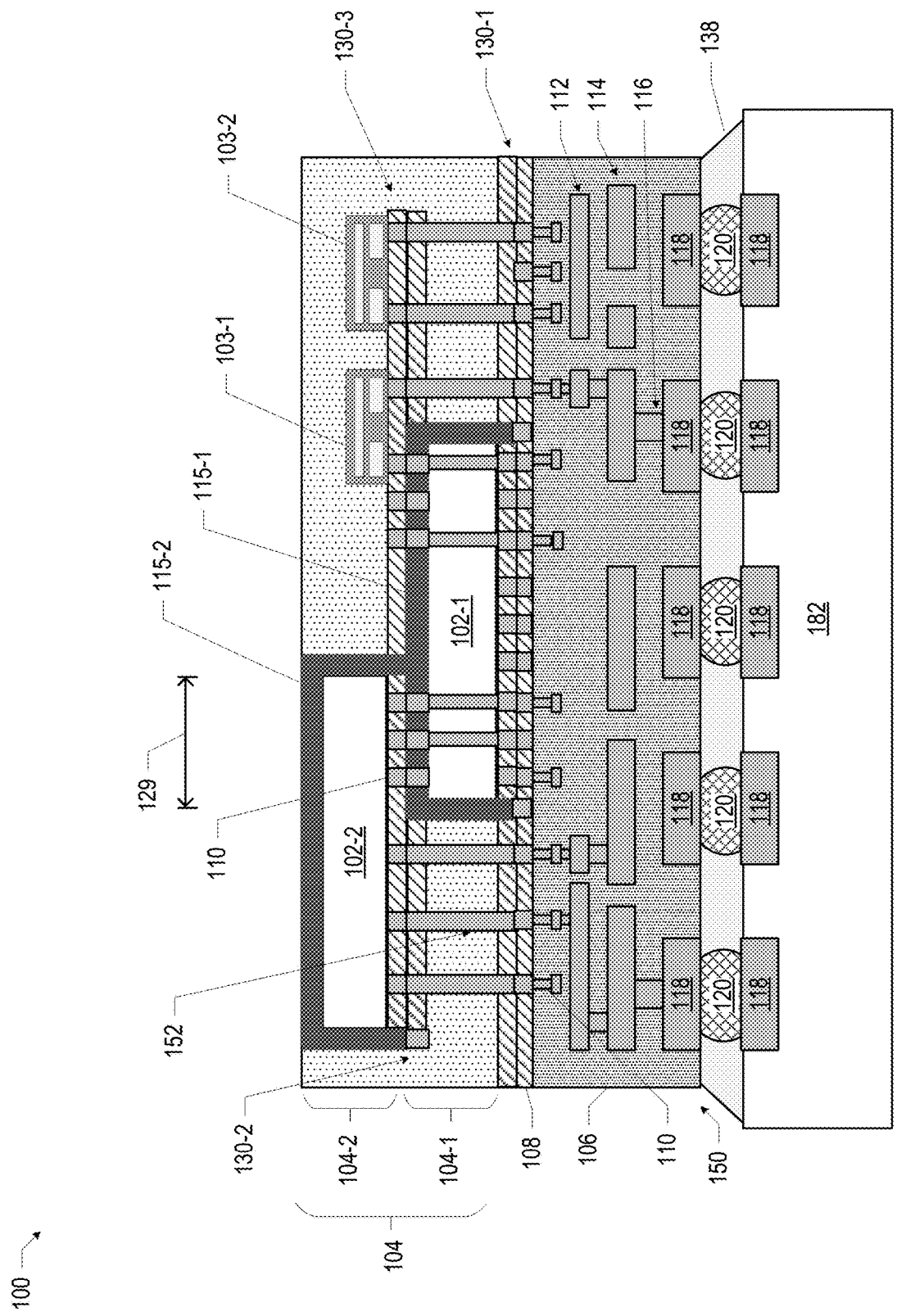
FIG. 5 is a side, cross-sectional view of an example microelectronic assembly including a contiguous shield structure, in accordance with various embodiments.

FIG. 5 is a side, cross-sectional view of an example microelectronic assembly 100, in accordance with various embodiments. The microelectronic assembly 100 may include a multi-layer die subassembly 104 having a contiguous shield structure 115. The multi-layer die subassembly 104 may include a first microelectronic component 102-1 having a first RF shield structure 115-1 in a first dielectric layer 104-1 coupled to the interposer 150 via a first hybrid bonding region 130-1, a second microelectronic component 102-2 having a second RF shield structure 115-2 in a second dielectric layer 104-2 coupled to the first microelectronic component 102-1 via a second hybrid bonding region 130-2, and a first RF-generating element 103-1 and a second RF-generating element 103-2 in the second dielectric layer 104-2 coupled to the first microelectronic component 102-1 and to the conductive pillars 152 via a hybrid bonding region 130-3. The first and second microelectronic components 102-1, 102-2 may be RF-affected components. The first RF shield structure 115-1 may cover the top surface and the side surfaces of the first microelectronic component 102-1. The second RF shield structure 115-2 may cover the top surface and the side surfaces of the second microelectronic component 102-2. The first RF shield structure 115-1 may be coupled (e.g., via hybrid bonding) to the second RF shield structure 115-2 to form a contiguous RF shield structure 115 around the top and side surfaces of the first and second microelectronic components 102-1, 102-2 and in an overlap portion 129 between the first and second microelectronic components 102-1, 102-2. The overlap portion 129 of the RF shield structure 115 protects top surfaces and the side surfaces of the first and second microelectronic components 102-1, 102-2 and the interface between the first and second microelectronic components 102-1, 102-2, effectively shielding the first and second microelectronic components 102-1, 102-2 from RF interference generated by the first and second RF-generating elements 103-1, 103-2. In some embodiments, the first microelectronic component 102-1 may include an RF-generating component (not shown).

Figure 6:
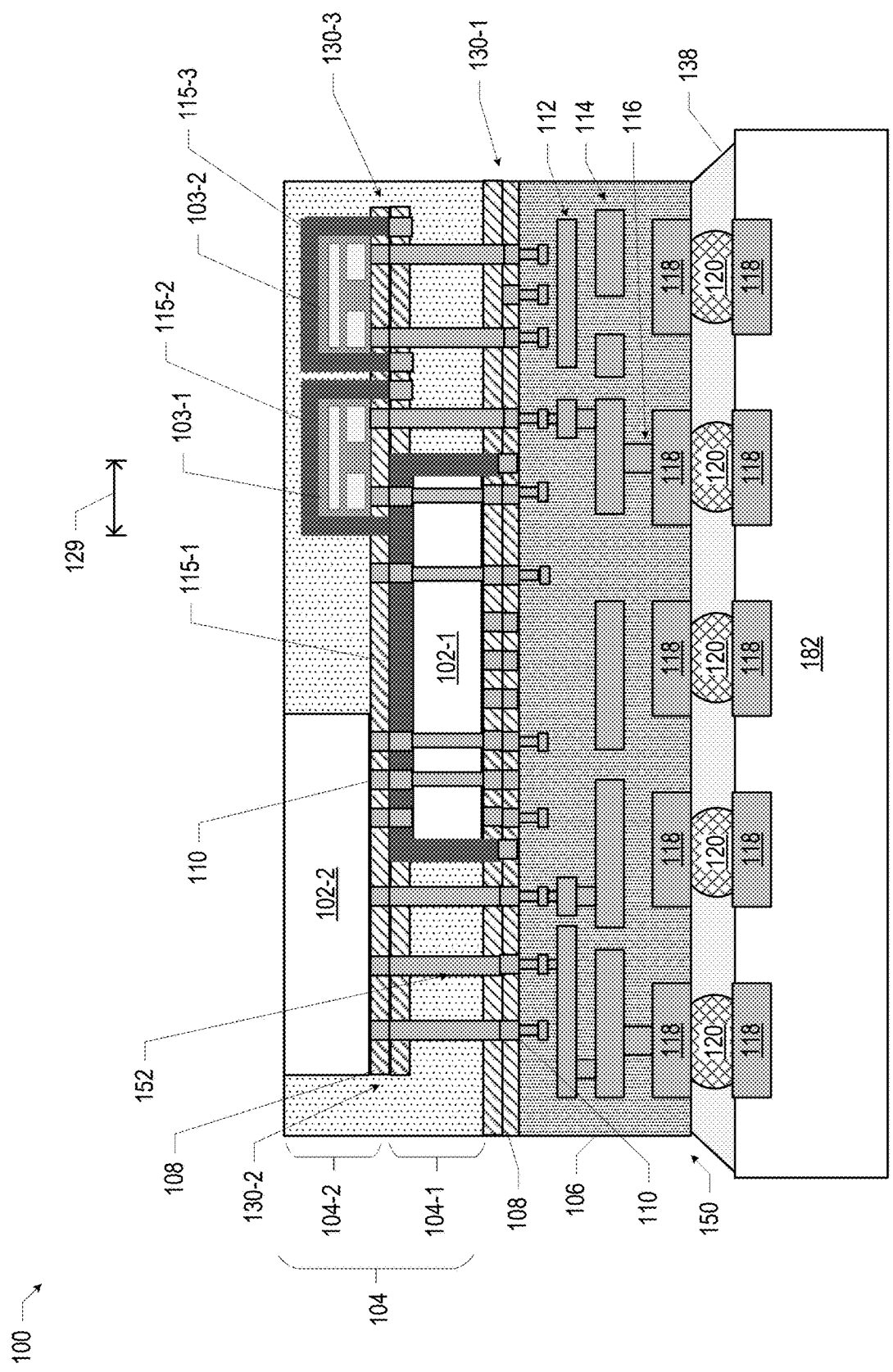
FIG. 6 is a side, cross-sectional view of an example microelectronic assembly including a contiguous shield structure, in accordance with various embodiments.

FIG. 6 is a side, cross-sectional view of an example microelectronic assembly 100, in accordance with various embodiments. The microelectronic assembly 100 may include a multi-layer die subassembly 104 having a contiguous RF shield structure 115. The multi-layer die subassembly 104 may include a first microelectronic component 102-1 having a first RF shield structure 115-1 in a first dielectric layer 104-1 coupled to the interposer 150 via a first hybrid bonding region 130-1, a second microelectronic component 102-2 in a second dielectric layer 104-2 coupled to the first microelectronic component 102-1 via a second hybrid bonding region 130-2, a first RF-generating element 103-1 having a second RF shield structure 115-2 in the second dielectric layer 104-2 coupled to the first microelectronic component 102-1 and to the conductive pillars 152 via a hybrid bonding region 130-3, and a second RF-generating element 103-2 having a third RF shield structure 115-3 in the second dielectric layer 104-2 coupled to the conductive pillars 152 via the hybrid bonding region 130-3. The first and second microelectronic components 102-1, 102-2 may be RF-affected components. The first RF shield structure 115-1 may cover the top surface and the side surfaces of the first microelectronic component 102-1. The second RF shield structure 115-2 may cover the top surface and the side surfaces of the first RF-generating element 103-1. The first RF shield structure 115-1 may be coupled (e.g., via hybrid bonding) to the second RF shield structure 115-2 to form a contiguous RF shield structure 115 around the top and side surfaces of the first microelectronic component 102-1 and the first RF-generating element 103-1 and in an overlap portion 129 between the first microelectronic component 102-1 and the first RF-generating element 103-1. The overlap portion 129 of the contiguous RF shield structure 115 protects top surfaces and the side surfaces of the first microelectronic component 102-1 and the interface between the first microelectronic component 102-1 and the first RF-generating element 103-1, effectively shielding the first microelectronic component 102-1 from RF interference generated by the first and second RF-generating elements 103-1, 103-2. The third RF shield structure 115-3 may cover the top surface and the side surfaces of the second RF-generating element 103-2 forming a separate RF shield structure that shields the top surface and side surfaces against transmitting RF interference, but not the bottom surface. In some embodiments, the first microelectronic component 102-1 may include an RF-generating component (not shown).

Figure 7A:
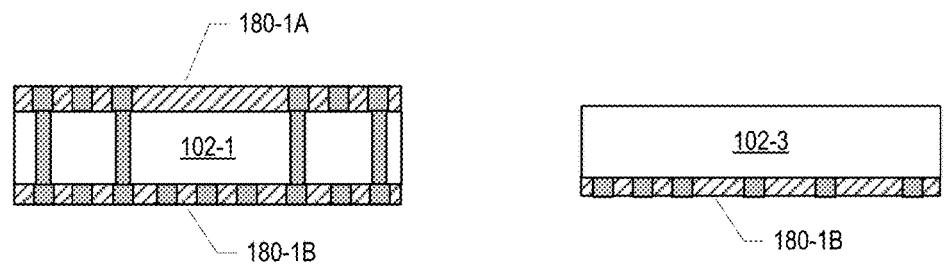
FIGS. 7A-7G are side, cross-sectional views of various stages in an example process for manufacturing the microelectronic assembly of FIG. 1, in accordance with various embodiments.

Any suitable techniques may be used to manufacture the microelectronic assemblies disclosed herein. FIGS. 7A-7G are side, cross-sectional views of various stages in an example process for manufacturing the microelectronic assembly of FIG. 1, in accordance with various embodiments. Although the operations discussed below with reference to FIGS. 7A-7G (and others of the accompanying drawings representing manufacturing processes) are illustrated in a particular order, these operations may be performed in any suitable order. FIG. 7A illustrates a microelectronic component 102-1 having HB interfaces 180-1A, 180-1B and a microelectronic component 102-3 having an HB interface 180-1B.

Figure 7B:
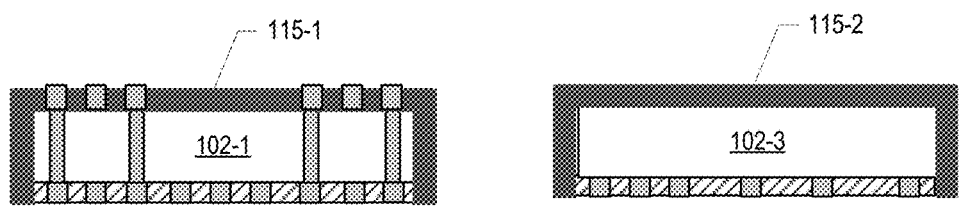

FIG. 7B illustrates microelectronic component 102-1 subsequent to providing a magnetic conductive material on a top and side surfaces to form an RF shield structure 115-1 and microelectronic component 102-3 subsequent to providing a magnetic conductive material on a top and side surfaces to form an RF shield structure 115-2. The magnetic conductive material may be deposited using any suitable technique, including, for example, by sputtering, ALD, CVD, PECVD, lamination, or by growing the magnetic conductive material on the microelectronic component 102, as described above with reference to FIG. 1.

Figure 7C:
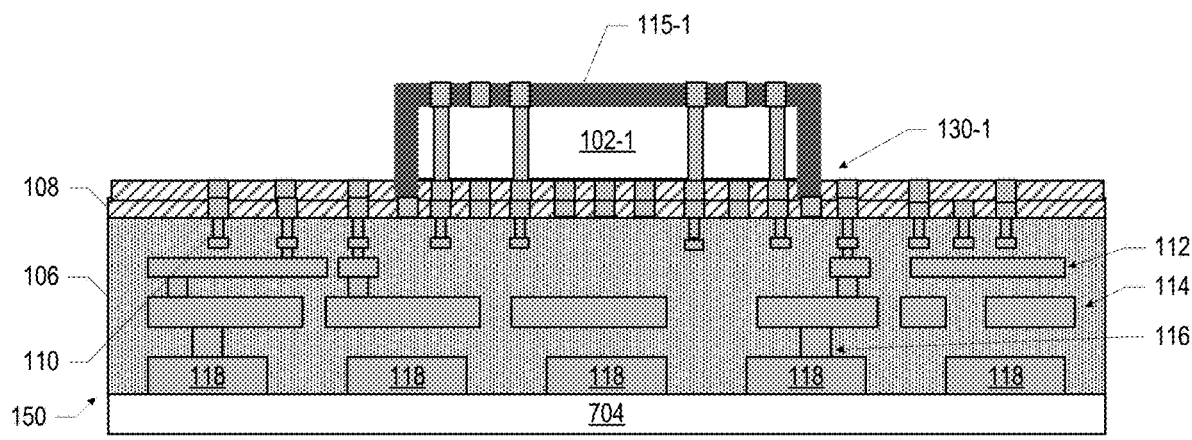

FIG. 7C illustrates an assembly including an interposer 150 mounted on a carrier 704 subsequent to hybrid bonding the microelectronic component 102-1 to the interposer 150. In particular, HB interface 180 (not labeled) of the microelectronic component 102-1 may be brought into contact with the HB interface 180 of the interposer 150, and heat and/or pressure to be applied to bond the contacting HB interfaces 180 to form HB region 130-1 (with HB region 130-1 corresponding to the HB interfaces 180-1 and 180-2, respectively). The carrier 704 may include any suitable material, and in some embodiments, may include a semiconductor wafer (e.g., a silicon wafer) or glass (e.g., a glass panel). When the interposer 150 is an organic interposer, the interposer 150 may be advantageously manufactured on the carrier 704, which may provide a mechanically stable surface on which the layers of the interposer 150 may be formed.

Figure 7D:
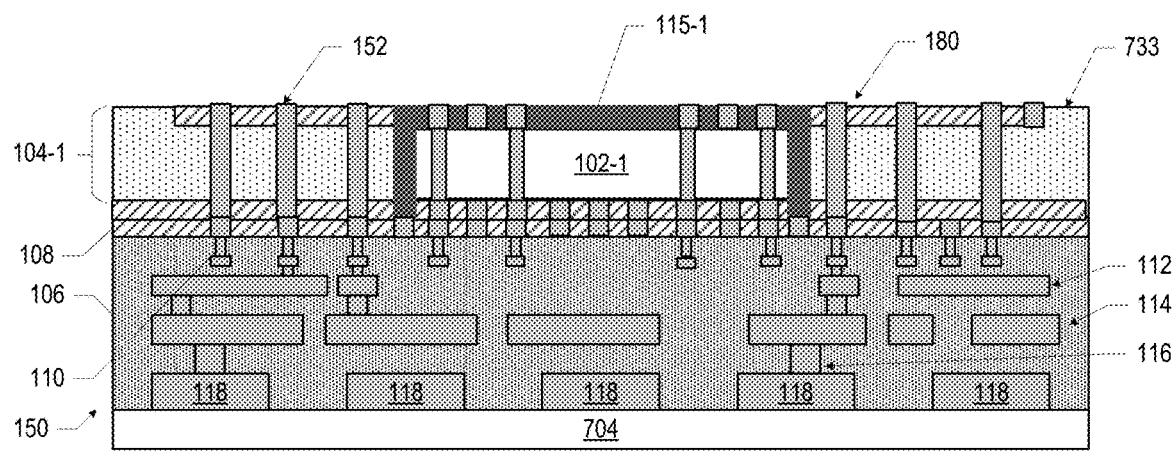

FIG. 7D illustrates an assembly subsequent to forming a plurality of conductive pillars 152 and providing an insulating material 733 around the plurality of conductive pillars 152 and the microelectronic component 102-1 to form the first dielectric layer 104-1 of the multi-die subassembly 104. The first dielectric layer 104-1 may further include an HB interface 180 at a top surface. In some embodiments, the insulating material 533 may be a mold material, such as an organic polymer with inorganic silica particles, an epoxy material, or a silicon and nitrogen material (e.g., in the form of silicon nitride). In some embodiments, the insulating material 733 is a dielectric material. In some embodiments, the dielectric material may include an organic dielectric material, a fire retardant grade 4 material (FR-4), BT resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). The dielectric material may be formed using any suitable process, including lamination, or slit coating and curing. In some embodiments, the insulating material 733 may extend above and remain above the microelectronic component 102-1, while in other embodiments, the insulating material 733 may be polished back to expose the top surface of the microelectronic component 102-1, as shown. If the dielectric layer is formed to completely cover the conductive pillars 152 and the microelectronic component 102-1, the dielectric layer may be removed to expose the RF shield structure and/or the conductive contacts at the top surface of the microelectronic component 102-1 and the top surfaces of the conductive pillars 152 using any suitable technique, including grinding, or etching, such as a wet etch, a dry etch (e.g., a plasma etch), a wet blast, or a laser ablation (e.g., using excimer laser). In some embodiments, the thickness of the insulating material 733 may be minimized to reduce the etching time required.

The conductive pillars 152 may take the form of any of the embodiments disclosed herein, and may be formed using any suitable technique, for example, a lithographic process or an additive process, such as cold spray or 3-dimensional printing. For example, the conductive pillars 152 may be formed by depositing, exposing, and developing a photoresist layer on the top surface of the carrier 704. The photoresist layer may be patterned to form cavities in the shape of the conductive pillars. Conductive material, such as copper, may be deposited in the openings in the patterned photoresist layer to form the conductive pillars 152. The conductive material may be depositing using any suitable process, such as electroplating, sputtering, or electroless plating. The photoresist may be removed to expose the conductive pillars 152. In another example, a photo-imageable dielectric may be used to form the conductive pillars 152. In some embodiments, a seed layer (not shown) may be formed on the top surface of the carrier 704 prior to depositing the photoresist material and the conductive material. The seed layer may be any suitable conductive material, including copper. The seed layer may be removed, after removing the photoresist layer, using any suitable process, including chemical etching, among others. In some embodiments, the seed layer may be omitted. The conductive pillars may have any suitable dimensions and may span one or more layers. For example, in some embodiments, an individual conductive pillar may have an aspect ratio (height:diameter) between 1:1 and 4:1 (e.g., between 1:1 and 3:1). In some embodiments, an individual conductive pillar may have a diameter (e.g., cross-section) between 10 microns and 1000 microns. For example, an individual conductive pillar may have a diameter between 50 microns and 400 microns. In some embodiments, an individual conductive pillar may have a height (e.g., z-height or thickness) between 50 and 500 microns. The conductive pillars may have any suitable cross-sectional shape, for example, square, triangular, and oval, among others.

Figure 7E:
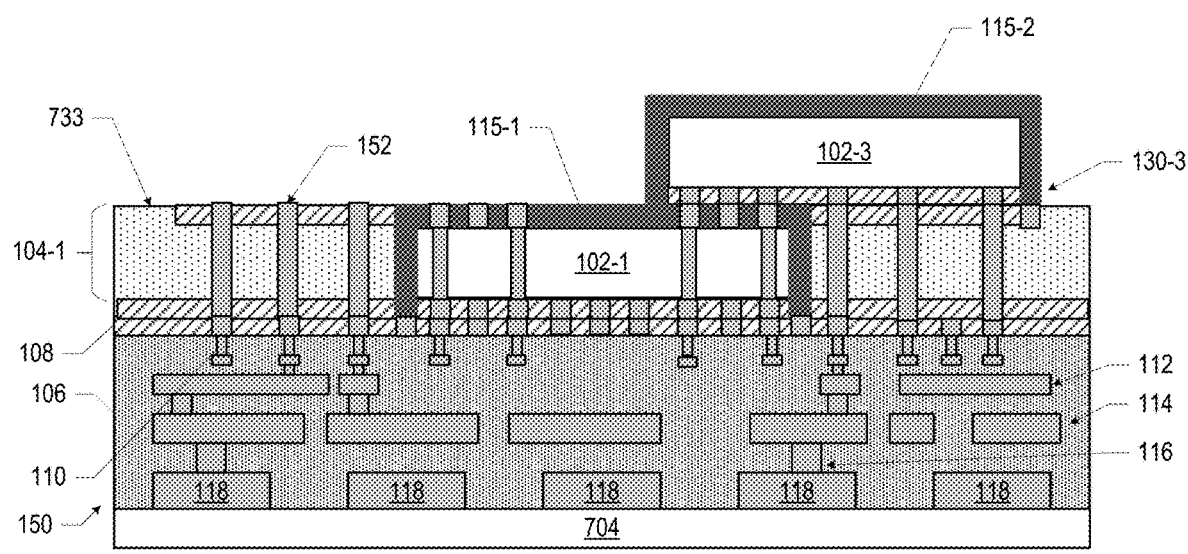

FIG. 7E illustrates an assembly subsequent to hybrid bonding the microelectronic component 102-3 to the microelectronic component 102-1 and bonding the RF shield structure 115-2 to the RF shield structure 115-1. In particular, HB interface 180 (not labeled) of the microelectronic component 102-3 may be brought into contact with the HB interface 180 (not labeled) of the microelectronic component 102-1, and heat and/or pressure to be applied to bond the contacting HB interfaces 180 to form HB region 130-3. The RF shield structure 115-2 is bonded to RF shield structure 115-1 to form a contiguous RF shield structure 115, as described above with reference to FIG. 1.

Figure 7F:
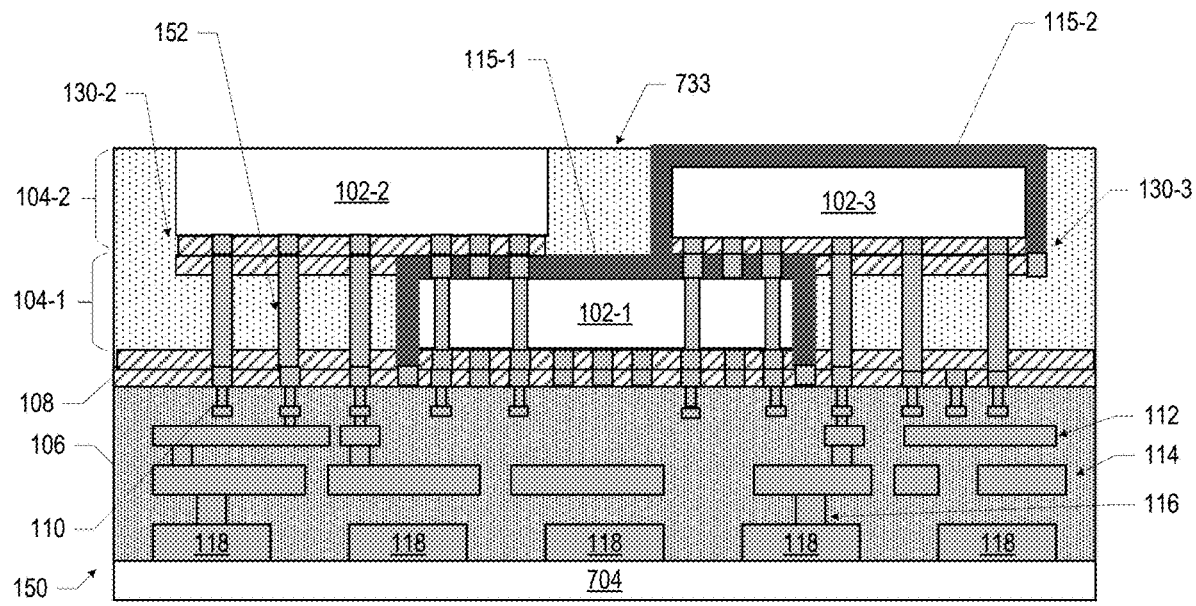

FIG. 7F illustrates an assembly subsequent to hybrid bonding the microelectronic component 102-2 to the microelectronic component 102-1 and providing an insulating material 733 around the microelectronic components 102-2, 102-3 to form the second dielectric layer 104-2 of the multi-die subassembly 104. In particular, HB interface 180 (not labeled) of the microelectronic component 102-2 may be brought into contact with the HB interface 180 (not labeled) of the microelectronic component 102-1, and heat and/or pressure to be applied to bond the contacting HB interfaces 180 to form HB region 130-2. The insulating material 733 may be formed as described above with reference to FIG. 7D.

Figure 7G:
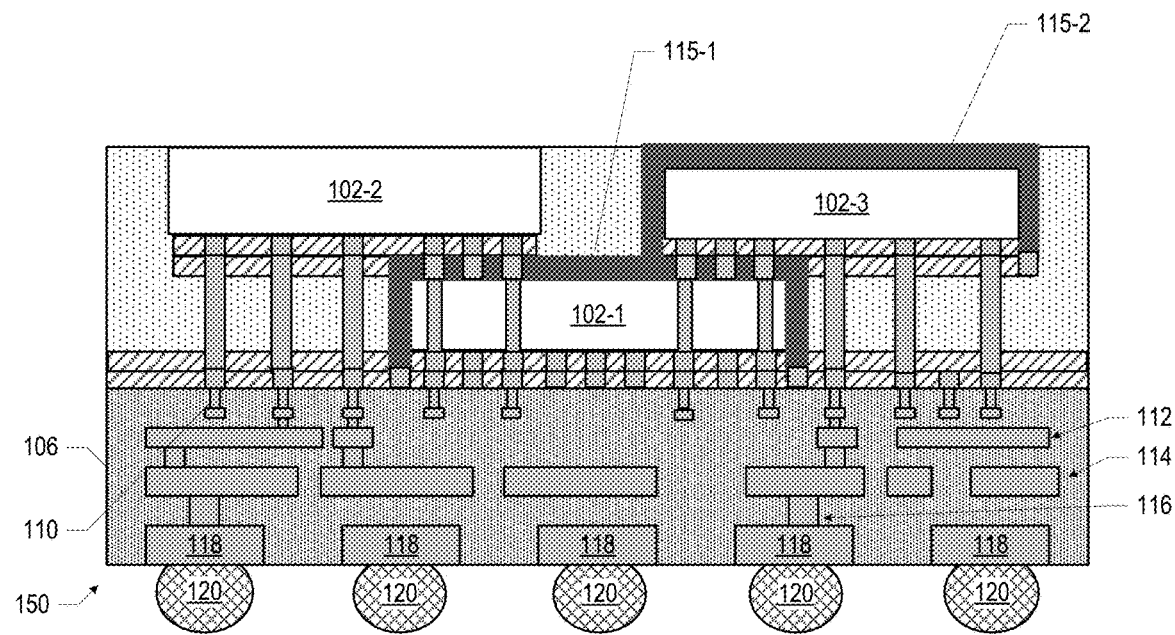

FIG. 7G illustrates an assembly subsequent to removing the carrier 704 from the assembly of FIG. 7F, and providing solder 120 on the newly exposed conductive contacts 118. The assembly of FIG. 7G may itself be a microelectronic assembly 100, as shown. Further manufacturing operations may be performed on the microelectronic assembly 100 of FIG. 7G to form other microelectronic assemblies 100; for example, the solder 120 may be used to couple the microelectronic assembly 100 of FIG. 7G to a support component 182, and a TIM 154 and heat transfer structure 156 may be provided on the top surface of the microelectronic assembly 100 of FIG. 7G, similar to the microelectronic assembly 100 of FIG. 1.

Microelectronic assemblies 100 including multiple tiers of microelectronic components 102 may be formed in a manner discussed above with reference to FIGS. 7A-7G, with the additional tiers of microelectronic components 102 and/or RF-generating elements 103 coupled to the preceding assemblies prior to deposition of the insulating material 733. In some embodiments, the RF-generating elements 103 may be coupled to the preceding assemblies subsequent to deposition of the insulating material 733. In some other embodiments, a microelectronic assembly 100 including multiple tiers of microelectronic components 102 may be formed by first assembling the tiers of microelectronic components 102, and then coupling the assembled tiers to an interposer 150. A microelectronic assembly 100 may not be limited to two tiers of microelectronic components 102, but may include three or more tiers, as desired. Further, although the microelectronic components 102 in an individual tier in FIG. 1 are depicted as having a same height, this is simply for ease of illustration, and microelectronic components 102 in any individual tier in a microelectronic assembly 100 may have different heights. Further, not every microelectronic component 102 in a microelectronic assembly 100 may be part of a stack of multiple microelectronic components 102; for example, in some variants of the microelectronic assembly 100 of FIG. 1, no microelectronic component 102-2 may be present on top of the microelectronic component 102-1.

The microelectronic components 102 and microelectronic assemblies 100 disclosed herein may be included in any suitable electronic component. FIGS. 8-11 illustrate various examples of apparatuses that may include, or be included in, as suitable, any of the microelectronic components 102 and microelectronic assemblies 100 disclosed herein.

Figure 8:
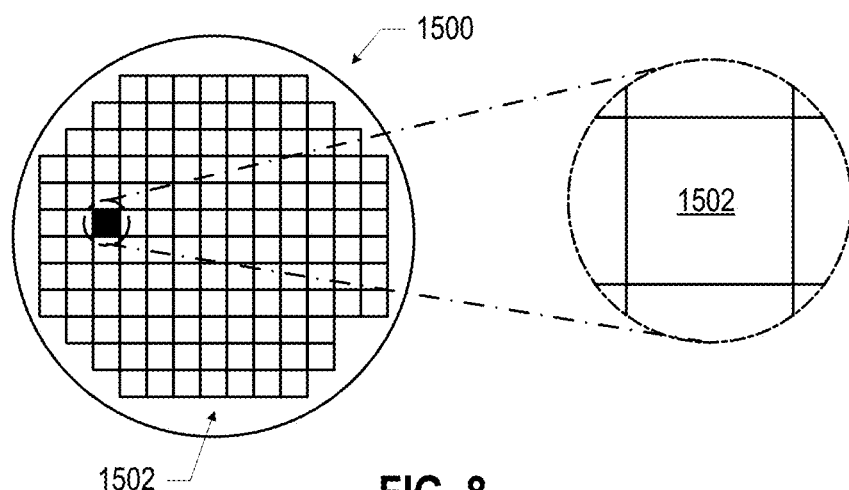
FIG. 8 is a top view of a wafer and dies that may be included in a microelectronic assembly, in accordance with any of the embodiments disclosed herein.

FIG. 8 is a top view of a wafer 1500 and dies 1502 that may be included in any of the microelectronic components 102 disclosed herein. For example, a die 1502 may serve as a microelectronic component 102, or may be included in a microelectronic component 102. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 9, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 11) or other logic that is configured to store information in the memory devices or execute instructions stored in the memory array.

Figure 9:
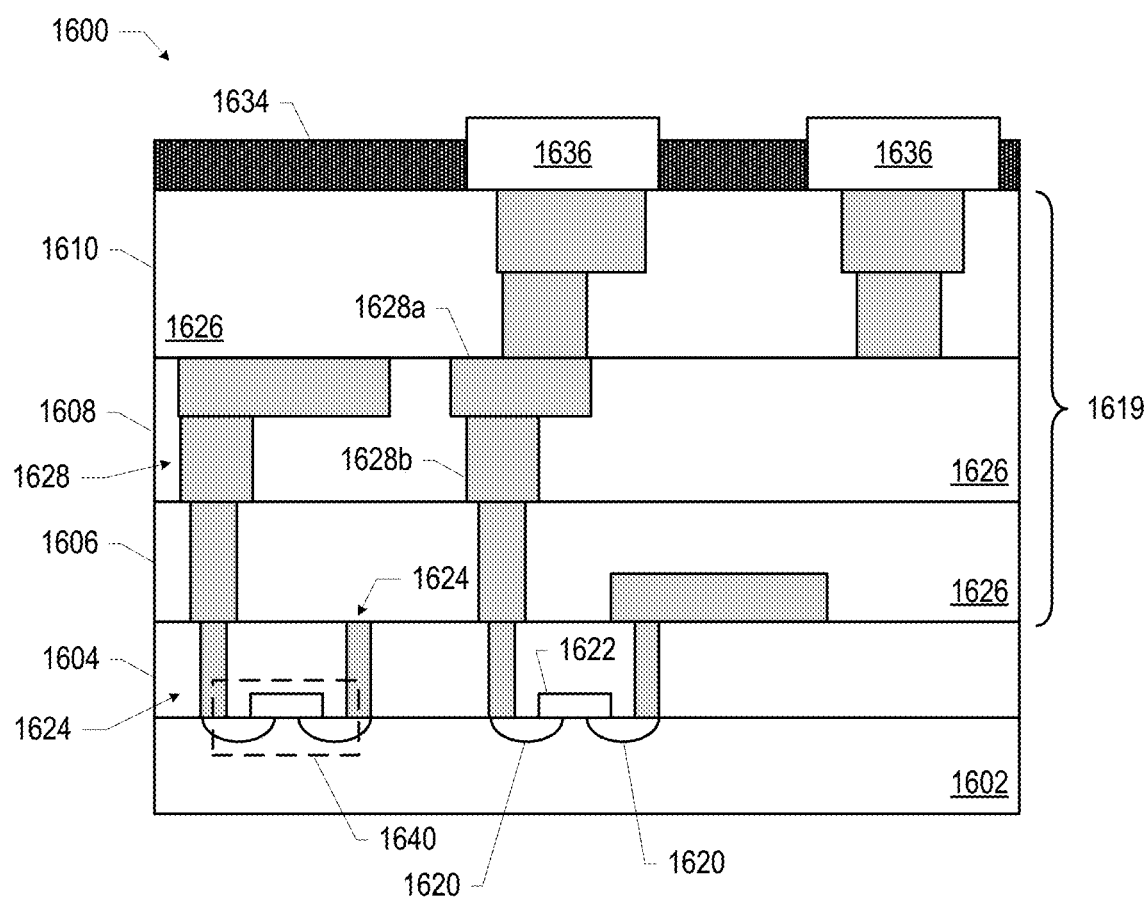
FIG. 9 is a cross-sectional side view of an IC device that may be included in a microelectronic assembly, in accordance with any of the embodiments disclosed herein.

FIG. 9 is a side, cross-sectional view of an IC device 1600 that may be included in any of the microelectronic components 102 disclosed herein. For example, an IC device 1600 (e.g., as part of a die 1502, as discussed above with reference to FIG. 8) may serve as a microelectronic component 102, or may be included in a microelectronic component 102. One or more of the IC devices 1600 may be included in one or more dies 1502 (FIG. 8). The IC device 1600 may be formed on a substrate 1602 (e.g., the wafer 1500 of FIG. 8) and may be included in a die (e.g., the die 1502 of FIG. 8). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 8) or a wafer (e.g., the wafer 1500 of FIG. 8).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 9 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 9 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 9). Although a particular number of interconnect layers 1606-1610 is depicted in FIG. 9, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 9. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 9. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 9, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 10:
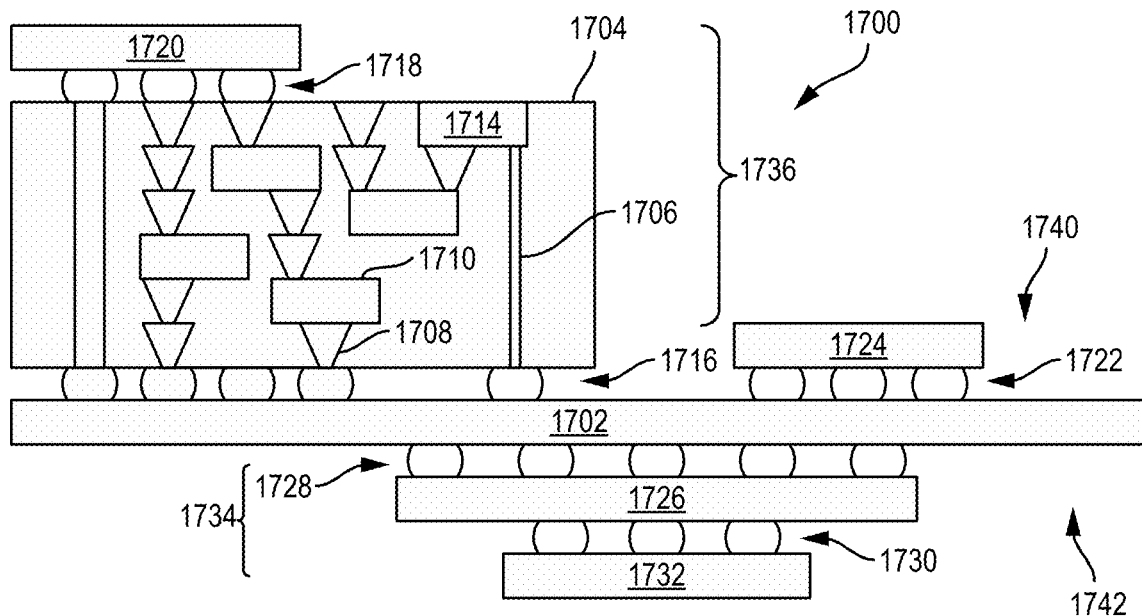
FIG. 10 is a cross-sectional side view of an IC device assembly that may include a microelectronic assembly, in accordance with any of the embodiments disclosed herein.

FIG. 10 is a side, cross-sectional view of an IC device assembly 1700 that may include any of the microelectronic components 102 and/or microelectronic assemblies 100 disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may include any of the embodiments of the microelectronic assemblies 100 disclosed herein (e.g., may include multiple microelectronic components 102 coupled together by hybrid bonding).

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 10 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 10), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 10, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 8), an IC device (e.g., the IC device 1600 of FIG. 9), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 10, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to TSVs 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and micro-electromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 10 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 11:
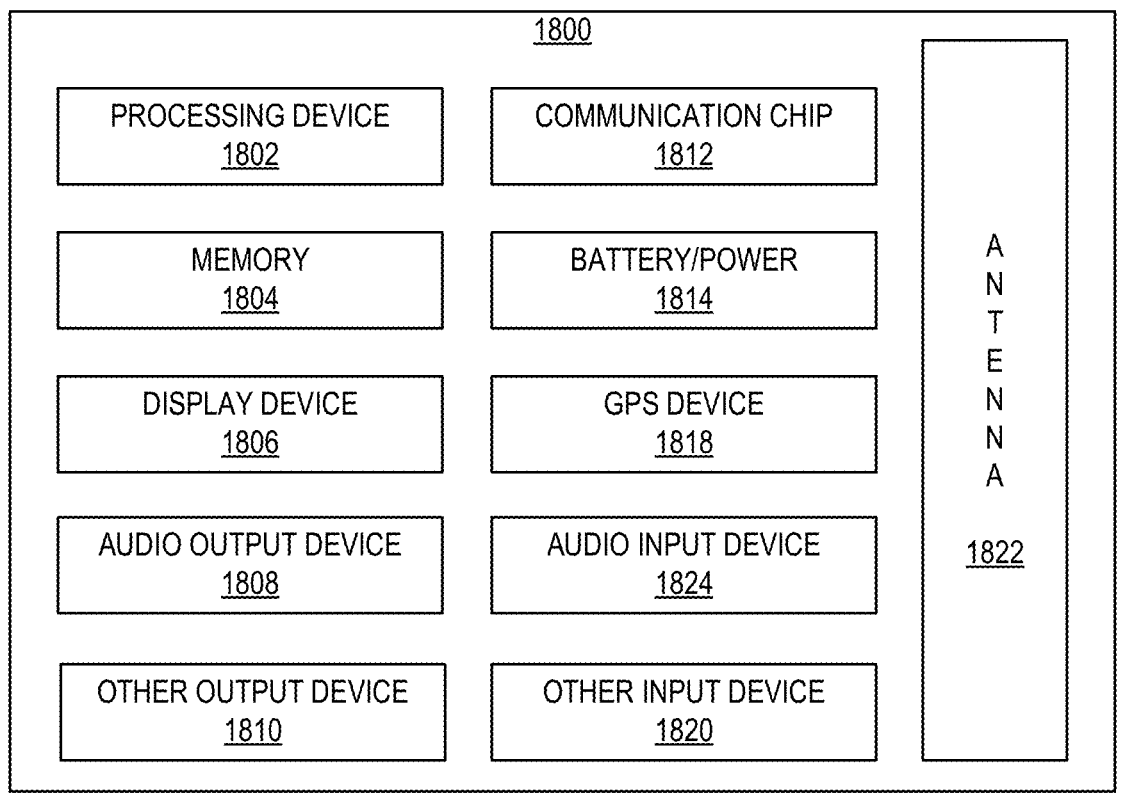
FIG. 11 is a block diagram of an example electrical device that may include a microelectronic assembly, in accordance with any of the embodiments disclosed herein.

FIG. 11 is a block diagram of an example electrical device 1800 that may include any of the microelectronic components 102 and/or microelectronic assemblies 100 disclosed herein. For example, any suitable ones of the components of the electrical device 1800 may include one or more of the IC device assemblies 1700, IC devices 1600, or dies 1502 disclosed herein. A number of components are illustrated in FIG. 11 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 11, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-M RAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is a microelectronic assembly, including a first microelectronic component, embedded in a first dielectric layer, including a surface and one or more side surfaces at least partially encapsulated by a first magnetic conductive material; and a second microelectronic component, embedded in a second dielectric layer on the first dielectric layer, including a surface and one or more side surfaces at least partially encapsulated by a second magnetic conductive material, wherein the second microelectronic component is coupled to the surface of the first microelectronic component by a hybrid bonding region, and wherein the second magnetic conductive material is coupled to the first magnetic conductive material.

Example 2 may include the subject matter of Example 1, and may further specify that the magnetic conductive material includes at least one of at least one of manganese, iron, cobalt, molybdenum, nickel, copper, vanadium, indium, aluminum, gallium, silicon, germanium, tin, or antimony.

Example 3 may include the subject matter of Example 1 or 2, and may further specify that a portion of the one or more side surfaces at least partially encapsulated by the second magnetic conductive material is coupled to a portion of the surface at least partially encapsulated by the first magnetic conductive material.

Example 4 may include the subject matter of Example 1 or 2, and may further specify that a portion of the surface at least partially encapsulated by the second magnetic conductive material is coupled to a portion of the surface at least partially encapsulated by the first magnetic conductive material.

Example 5A may include the subject matter of Example 1, and may further specify that the second microelectronic component includes one or more of an inductor, a capacitor, an antenna, a coil, and a voltage regulator.

Example 5B may include the subject matter of Example 1, and may further specify that the second microelectronic component is a source of radio frequency (RF) interference.

Example 6A may include the subject matter of Example 5A, and may further specify that the first microelectronic component includes one or more of an inductor, a capacitor, an antenna, a coil, and a voltage regulator.

Example 6B may include the subject matter of Example 1, and may further specify that the first and second microelectronic components are a source of RF interference.

Example 7 may include the subject matter of Example 1 or 2, and may further specify that the hybrid bonding region is first hybrid bonding region, and may further include a third microelectronic component embedded in the second dielectric layer and coupled to the surface of the first microelectronic component by a second hybrid bonding region.

Example 8 may include the subject matter of Example 7, and may further specify that the third microelectronic component further includes a surface and one or more side surfaces at least partially encapsulated by a third magnetic conductive material, wherein the third magnetic conductive material is coupled to the first magnetic conductive material.

Example 9 may include the subject matter of Example 1 or 2, and may further include a transmission line in the first dielectric layer, wherein the transmission line is within a footprint of the second microelectronic component.

Example 10 is a microelectronic assembly, including a first microelectronic component in a first dielectric layer, having a first surface, an opposing second surface, and one or more side surfaces, including a first magnetic conductive material at least partially encapsulating the second surface and the one or more side surfaces; and a second microelectronic component in a second dielectric layer on the first dielectric layer, having a first surface, an opposing second surface, and one or more side surfaces, including a second magnetic conductive material at least partially encapsulating the second surface and the one or more side surfaces, wherein first surface of the second microelectronic component is coupled to the second surface of the first microelectronic component by a hybrid bonding region, and wherein the second magnetic conductive material is hybrid bonded to the first magnetic conductive material.

Example 11 may include the subject matter of Example 10, and may further specify that the magnetic conductive material includes at least one of at least one of manganese, iron, cobalt, molybdenum, nickel, copper, vanadium, indium, aluminum, gallium, silicon, germanium, tin, or antimony.

Example 12 may include the subject matter of Example 10 or 11, and may further specify that a portion of the one or more side surfaces at least partially encapsulated by the second magnetic conductive material is coupled to a portion of the second surface at least partially encapsulated by the first magnetic conductive material.

Example 13 may include the subject matter of Example 10 or 11, and may further specify that a portion of the surface at least partially encapsulated by the second magnetic conductive material is coupled to a portion of the surface at least partially encapsulated by the first magnetic conductive material.

Example 14A may include the subject matter of Example 10, and may further specify that the second microelectronic component includes one or more of an inductor, a capacitor, an antenna, a coil, and a voltage regulator.

Example 14B may include the subject matter of Example 10, and may further specify that the second microelectronic component is a source of radio frequency (RF) interference.

Example 15A may include the subject matter of Example 14A, and may further specify that the first microelectronic component includes one or more of an inductor, a capacitor, an antenna, a coil, and a voltage regulator.

Example 15B may include the subject matter of Example 1, and may further specify that the first and second microelectronic components are a source of RF interference.

Example 16 may include the subject matter of Example 10, and may further specify that the second microelectronic component is an RF die.

Example 17 may include the subject matter of Example 10, wherein the hybrid bonding region is a first hybrid bonding region, and may further include a third microelectronic component, embedded in the second dielectric layer and coupled to the first microelectronic component by a second hybrid bonding region.

Example 18 may include the subject matter of Example 17, and may further specify that the third microelectronic component further includes a surface and one or more side surfaces encapsulated by a third magnetic conductive material, wherein the third magnetic conductive material is coupled by hybrid bonding to the first magnetic conductive material, and the first, second, and third magnetic conductive materials form a contiguous magnetic conductive material.

Example 19 may include the subject matter of Example 17, and may further specify that the third microelectronic component is an antenna.

Example 20 may include the subject matter of Example 10, and may further include a package substrate, wherein the first magnetic conductive material is coupled to a ground connection on the package substrate.

Example 21 is a method of manufacturing a microelectronic assembly, including at least partially encapsulating a first microelectronic component, having a first surface, an opposing second surface, and one or more side surfaces, by depositing a first magnetic conductive material on the second surface and side surfaces of the first microelectronic component; at least partially encapsulating a second microelectronic component, having a first surface, an opposing second surface, and one or more side surfaces, by depositing a second magnetic conductive material on the second surface and side surfaces of the second microelectronic component; coupling the first surface of the first microelectronic component to a package substrate by a first hybrid bonding region; coupling the first surface of the second microelectronic component to the second surface of the first microelectronic component by a second hybrid bonding region; and coupling the first magnetic conductive material to the second magnetic conductive material.

Example 22 may include the subject matter of Example 21, and may further specify that the magnetic conductive material includes at least one of manganese, iron, cobalt, molybdenum, nickel, copper, vanadium, indium, aluminum, gallium, silicon, germanium, tin, or antimony.

Example 23 may include the subject matter of Example 21 or 22, and may further include depositing an insulating material on the package substrate and around the first microelectronic component prior to coupling the second microelectronic component to the first microelectronic component.

Example 24 may include the subject matter of Example 23, and may further include forming a conductive pillar through the insulating material; coupling a first end of the conductive pillar to the package substrate; and coupling an opposing second end of the conductive pillar to the first surface of the second microelectronic component.

Example 25 is a method of manufacturing a microelectronic assembly, including at least partially encapsulating a first microelectronic component, having a first surface, an opposing second surface, and one or more side surfaces, by depositing a first magnetic conductive material on the second surface and side surfaces of the first microelectronic component; at least partially encapsulating a second microelectronic component, having a first surface, an opposing second surface, and one or more side surfaces, by depositing a second magnetic conductive material on the first surface and side surfaces of the second microelectronic component; coupling the first surface of the first microelectronic component to a package substrate by a first hybrid bonding region; coupling the first surface of the second microelectronic component to the second surface of the first microelectronic component by a second hybrid bonding region; and coupling the first magnetic conductive material to the second magnetic conductive material.

Example 26 may include the subject matter of Example 25, and may further specify that the magnetic conductive material includes at least one of manganese, iron, cobalt, molybdenum, nickel, copper, vanadium, indium, aluminum, gallium, silicon, germanium, tin, or antimony.

Example 27 may include the subject matter of Example 25 or 26, and may further include depositing an insulating material on the package substrate and around the first microelectronic component prior to coupling the second microelectronic component to the first microelectronic component.

Example 28 may include the subject matter of Example 27, and may further include forming a conductive pillar through the insulating material; coupling a first end of the conductive pillar to the package substrate; and coupling an opposing second end of the conductive pillar to the first surface of the second microelectronic component.

The invention claimed is:

1. A microelectronic assembly, comprising:
    a first microelectronic component, embedded in a first dielectric layer, including a surface and one or more side surfaces at least partially encapsulated by a first magnetic conductive material; and
    a second microelectronic component, embedded in a second dielectric layer on the first dielectric layer, including a surface and one or more side surfaces at least partially encapsulated by a second magnetic conductive material, wherein the second microelectronic component is coupled to the surface of the first microelectronic component by a hybrid bonding region, and wherein the second magnetic conductive material is coupled to the first magnetic conductive material.

2. The microelectronic assembly of claim 1, wherein the first magnetic conductive material and the second magnetic conductive material comprise at least one of manganese, iron, cobalt, molybdenum, nickel, copper, vanadium, indium, aluminum, gallium, silicon, germanium, tin, and/or antimony.

3. The microelectronic assembly of claim 1, wherein a portion of the one or more side surfaces at least partially encapsulated by the second magnetic conductive material is coupled to a portion of the surface at least partially encapsulated by the first magnetic conductive material.

4. The microelectronic assembly of claim 1, wherein a portion of the surface at least partially encapsulated by the second magnetic conductive material is coupled to a portion of the surface at least partially encapsulated by the first magnetic conductive material.

5. The microelectronic assembly of claim 1, wherein the second microelectronic component includes one or more of an inductor, a capacitor, an antenna, a coil, and a voltage regulator.

6. The microelectronic assembly of claim 5, wherein the first microelectronic component includes one or more of an inductor, a capacitor, an antenna, a coil, and a voltage regulator.

7. The microelectronic assembly of claim 1, wherein the hybrid bonding region is first hybrid bonding region, and further comprising:
    a third microelectronic component embedded in the second dielectric layer and coupled to the surface of the first microelectronic component by a second hybrid bonding region.

8. The microelectronic assembly of claim 7, wherein the third microelectronic component further includes a surface and one or more side surfaces at least partially encapsulated by a third magnetic conductive material, wherein the third magnetic conductive material is coupled to the first magnetic conductive material.

9. The microelectronic assembly of claim 1, further comprising:
    a transmission line in the first dielectric layer, wherein the transmission line is within a footprint of the second microelectronic component.

10. A microelectronic assembly, comprising:
    a first microelectronic component in a first dielectric layer, having a first surface, an opposing second surface, and one or more side surfaces, including a first magnetic conductive material at least partially encapsulating the second surface and the one or more side surfaces; and a second microelectronic component in a second dielectric layer on the first dielectric layer, having a first surface, an opposing second surface, and one or more side surfaces, including a second magnetic conductive material at least partially encapsulating the second surface and the one or more side surfaces, wherein the first surface of second microelectronic component is coupled to the second surface of the first microelectronic component by a hybrid bonding region, and wherein the second magnetic conductive material is hybrid bonded to the first magnetic conductive material.

11. The microelectronic assembly of claim 10, wherein the first magnetic conductive material and the second magnetic conductive material comprise at least one of manganese, iron, cobalt, molybdenum, nickel, copper, vanadium, indium, aluminum, gallium, silicon, germanium, tin, and/or antimony.

12. The microelectronic assembly of claim 10, wherein a portion of the one or more side surfaces at least partially encapsulated by the second magnetic conductive material is coupled to a portion of the second surface at least partially encapsulated by the first magnetic conductive material.

13. The microelectronic assembly of claim 10, wherein a portion of the surface at least partially encapsulated by the second magnetic conductive material is coupled to a portion of the surface at least partially encapsulated by the first magnetic conductive material.

14. The microelectronic assembly of claim 10, wherein the second microelectronic component includes one or more of an inductor, a capacitor, an antenna, a coil, and a voltage regulator.

15. The microelectronic assembly of claim 14, wherein the first microelectronic component includes one or more of an inductor, a capacitor, an antenna, a coil, and a voltage regulator.

16. The microelectronic assembly of claim 10, wherein the second microelectronic component is a radio frequency die.

* * * * *